United States Patent
Terreau et al.

(10) Patent No.: US 8,847,063 B2
(45) Date of Patent: *Sep. 30, 2014

(54) ENCAPSULATION OF SOLAR CELLS

(75) Inventors: Christine Terreau, Grandglise (BE);
Jean de la Croi Habimana, Lede (BE);
Stephen Jenkins, Bay City, MI (US)

(73) Assignee: Dow Corning Corporation, Midland, MI (US)

(*) Notice: Subject to any disclaimer, the term of this patent is extended or adjusted under 35 U.S.C. 154(b) by 1000 days.

This patent is subject to a terminal disclaimer.

(21) Appl. No.: 10/563,677

(22) PCT Filed: Jul. 2, 2004

(86) PCT No.: PCT/EP2004/007807
§ 371 (c)(1),
(2), (4) Date: Jun. 5, 2006

(87) PCT Pub. No.: WO2005/006451
PCT Pub. Date: Jan. 20, 2005

(65) Prior Publication Data
US 2006/0207646 A1 Sep. 21, 2006

(30) Foreign Application Priority Data

Jul. 7, 2003 (GB) .................................. 0315846.6
Jun. 4, 2004 (GB) .................................. 0412516.7

(51) Int. Cl.
*H01L 31/048* (2014.01)
*H01L 31/042* (2014.01)
*B32B 17/10* (2006.01)

(52) U.S. Cl.
CPC ...... *B32B 17/10018* (2013.01); *H01L 31/0422* (2013.01); *B32B 17/10788* (2013.01); *B32B 17/10706* (2013.01); *Y02E 10/50* (2013.01); *B32B 17/10798* (2013.01); *H01L 31/048* (2013.01)
USPC ............................. 136/251; 136/258; 136/259

(58) Field of Classification Search
USPC .......................................... 136/251, 258, 259
See application file for complete search history.

(56) References Cited

U.S. PATENT DOCUMENTS 2,613,184 A 10/1952 Catlin
2,938,938 A 5/1960 Dickson, Jr.
(Continued)

FOREIGN PATENT DOCUMENTS

EP    0 406 814       7/1990
EP    0261517 A3      8/1990
(Continued)

OTHER PUBLICATIONS

Abstract: Dennis, "Encapsulation of PV cells using silicone materials", Photovoltaic Specialist Conference, 1980, 2 pages.
(Continued)

*Primary Examiner* — Golam Mowla
(74) *Attorney, Agent, or Firm* — Howard & Howard Attorneys PLLC

(57) ABSTRACT

The present invention comprises a solar cell module and a method of encapsulating the module. The solar cell module comprises a rigid or flexible superstrate and/or substrate having one or more solar cells, and an encapsulent which is a cured liquid silicone encapsulant. The encapsulant composition preferably comprises a liquid diorganopolysiloxane having at least two Si-alkenyl groups per molecule, a silicone resin containing at least two alkenyl groups; a cross-linking agent in the form of a polyorganosiloxane having at least two silicon-bonded hydrogen atoms per molecule, in an amount such that the ratio of the number of moles of silicon-bonded hydrogen to the total number of moles of silicon-bonded alkenyl groups is from 0.1:1 to 5:1; and a hydrosilylation catalyst, preferably a platinum based catalyst. The continuous solar cell module encapsulation process comprising the steps of uniformly applying by spraying, coating or dispensing a predetermined volume of a liquid silicone encapsulant onto a solar cell module and curing said encapsulant thermally or by infrared radiation. The preferred method of applying the liquid silicone encapsulant on to the solar cell modules is by means of a curtain coater.

30 Claims, 3 Drawing Sheets

(56) References Cited

U.S. PATENT DOCUMENTS

Figure 1:
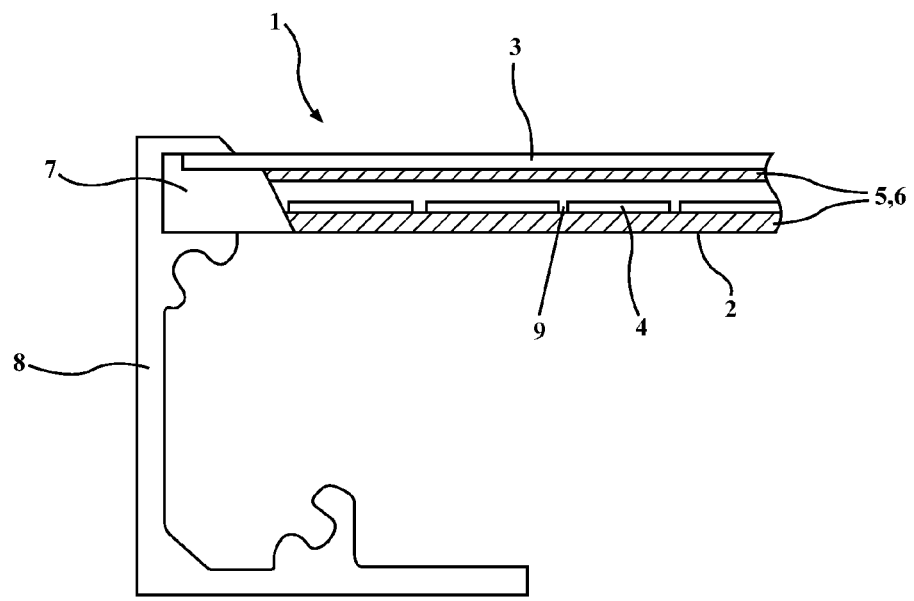

| | | | |
|---|---|---|---|
| 3,083,187 | A | 3/1963 | Stuart et al. |
| 3,284,406 | A | 11/1966 | Nelson |
| 3,565,719 | A | 2/1971 | Webb |
| 4,021,357 | A | 5/1977 | Morduchowitz et al. |
| 4,036,767 | A | 7/1977 | Yamamoto et al. |
| 4,037,010 | A | 7/1977 | Keller et al. |
| 4,056,405 | A | 11/1977 | Varadi |
| 4,057,439 | A | 11/1977 | Lindmayer |
| 4,089,705 | A | 5/1978 | Rubin |
| 4,093,473 | A | 6/1978 | Lindmayer |
| 4,143,949 | A | 3/1979 | Chen |
| 4,167,644 | A | 9/1979 | Kurth et al. |
| 4,210,462 | A | 7/1980 | Tourneux |
| 4,322,261 | A | 3/1982 | Dubois |
| 4,331,494 | A | 5/1982 | Duchateau et al. |
| 4,374,955 | A | 2/1983 | Gupta et al. |
| 4,402,841 | A | 9/1983 | Schieman |
| 4,415,759 | A | 11/1983 | Copeland et al. |
| 4,430,519 | A | 2/1984 | Young |
| 4,461,922 | A | 7/1984 | Gay et al. |
| 4,490,500 | A | 12/1984 | Smith |
| 4,549,033 | A | 10/1985 | Avenel et al. |
| 4,578,526 | A | 3/1986 | Nakano et al. |
| 4,605,813 | A | 8/1986 | Takeuchi et al. |
| 4,606,834 | A | 8/1986 | Hart et al. |
| 4,618,439 | A | 10/1986 | Brandi et al. |
| 4,650,596 | A | 3/1987 | Schlueter et al. |
| 4,666,617 | A | 5/1987 | Katayama et al. |
| 4,855,378 | A | 8/1989 | Pradl et al. |
| 4,867,894 | A | 9/1989 | Pennewiss et al. |
| 4,868,251 | A | 9/1989 | Reich et al. |
| 4,916,503 | A | 4/1990 | Uematsu et al. |
| 4,941,985 | A | 7/1990 | Benfaremo et al. |
| 4,986,924 | A | 1/1991 | Germanaud et al. |
| 5,011,544 | A | 4/1991 | Gaddy et al. |
| 5,013,468 | A | 5/1991 | Benfaremo |
| 5,024,953 | A | 6/1991 | Uematsu et al. |
| 5,055,213 | A | 10/1991 | Germanaud et al. |
| 5,217,540 | A | 6/1993 | Ogura |
| 5,290,366 | A | 3/1994 | Riemeier et al. |
| 5,476,553 | A | 12/1995 | Hanoka et al. |
| 5,524,989 | A | 6/1996 | Ichioka et al. |
| 5,527,932 | A | 6/1996 | Kasuya |
| 5,530,264 | A | 6/1996 | Kataoka et al. |
| 5,569,689 | A * | 10/1996 | Stein ........................... 524/188 |
| 5,582,653 | A | 12/1996 | Kataoka et al. |
| 5,660,646 | A | 8/1997 | Kataoka et al. |
| 6,175,075 | B1 * | 1/2001 | Shiotsuka et al. ............ 136/251 |
| 6,320,116 | B1 | 11/2001 | Hanoka |
| 6,384,318 | B1 | 5/2002 | Nomura |
| 6,607,936 | B2 | 8/2003 | Nomura |
| 2001/0054437 | A1 | 12/2001 | Komori et al. |
| 2002/0037963 | A1 | 3/2002 | Hara et al. |
| 2002/0129850 | A1 | 9/2002 | Nomura |
| 2003/0236380 | A1 | 12/2003 | Fehn et al. |
| 2005/0089696 | A1 | 4/2005 | Bosshammer |
| 2006/0207646 | A1 | 9/2006 | Terreau et al. |
| 2007/0264510 | A1 | 11/2007 | Fehn |
| 2009/0068475 | A1 | 3/2009 | Bosshammer |

FOREIGN PATENT DOCUMENTS

| | | |
|---|---|---|
| EP | 0 578 091 | 6/1993 |
| EP | 1 054 456 | 12/1999 |
| EP | 1644989 B1 | 10/2011 |
| GB | 2084793 A | 4/1982 |
| JP | 54-131485 U | 9/1979 |
| JP | 2000036611 | 2/2000 |
| JP | 2001-002922 A | 1/2001 |
| JP | 2003-086822 A | 3/2003 |
| JP | 2003069068 A | 3/2003 |
| JP | 2009-235265 A | 10/2009 |
| WO | WO 00/46817 A1 | 8/2000 |
| WO | WO 2005/006451 A1 | 1/2005 |
| WO | WO 2010/051355 A2 | 5/2010 |
| WO | WO 2011/107592 A1 | 9/2011 |

OTHER PUBLICATIONS

Final Report: Carmichael et al. "Review of World Experience and Properties of Materials for Encapsulation of Terrestrial Photovoltaic Arrays", No. ERAD/JPL-954328-76/4, 1976, 9 pages.

Article: Dennis, "Encapsulation of PV Cells Using Silicone Materials", IEEE, 1980, pp. 958-961.

English language translation and abstract for JP 2003-069068 extracted from PAJ database, dated Jul. 23, 2010, 43 pages.

English language translation for JP 2000036611 extracted from the PAJ database on Jul. 13, 2011, 37 pages.

D.R. Coulter et al., "Chemical Bonding Technology for Terrestrial Photovoltaic Modules", DOE/JPL-1012-91, JPL Publication, 1983, 70 pages.

English language abstract for EP 0261517 extracted from the espacenet.com database on Aug. 21, 2012, 31 pages.

English language abstract and machine-assisted translation for JP 2003-086822 extracted from the PAJ database on Aug. 1, 2012, 29 pages.

English language abstract and machine-assisted English translation for JP 2001-002922 extracted from the PAJ database on Feb. 28, 2013, 41 pages.

English language abstract and machine-assisted English translation for JP 2009-235265 extracted from the PAJ database on Jan. 22, 2014, 63 pages.

Kondo et al, "Low-cost amorphous silicon photovoltaic module encapsulated with liquid resin", Solar Energy Materials and Solar Cells, 49, (1997) pp. 127-133.

D.C. Carmichael et al., Final Report—Review of World Experience and Properties of Materials for Encapsulation of Terrestrial Photovoltaic Arrays to Jet Propulsion Laboratory California Institute of Technology for the Encapsulation Task of the Low-Cost Silicon Solar Array Project. Jul. 21, 1976, 196 pages.

Beatty, M.E. III, Woerner, C. V., and Crouch, R.K., Thermal and Particulate Radiation Effects on Potting Polymers, Journal of Materials JMLSA. vol. 5, No. 4, Dec. 1970, pp. 972-984.

Dow Corning Application Notes, 1977, 1 page.

International Search Report for Application No. PCT/EP2004/007807 dated Oct. 25, 2004, 3 pages.

* cited by examiner

ENCAPSULATION OF SOLAR CELLS

This invention relates to a solar cell and a process of applying a silicone based encapsulant material onto solar cells to form a solar cell module.

Solar or photovoltaic cells are semiconductor devices used to convert light into electricity (referred to hereafter as solar cells). Typically upon exposure to light, a solar cell generates a voltage across its terminals resulting in a consequent flow of electrons, the size of which is proportional to the intensity of the light impinging on the photovoltaic junction formed at the surface of the cell. Solar cells can be made from any suitable semiconductor materials such as for example, crystalline or polycrystalline silicon or thin film silicon, e.g. amorphous, semi crystalline silicon, gallium arsenide, copper indium diselenide, cadmium telluride, copper indium gallium diselenide, mixtures including any one or more of the latter and the like. There are generally currently two types of solar cells, wafers and thin films. A Wafer is a thin sheet of semiconductor material made by mechanically sawing it from a single crystal or multicrystal ingot or casting. Thin film based solar cells are continuous layers of semi-conducting materials typically deposited on a substrate or superstrate by sputtering or chemical vapour deposition processes or like techniques.

Because of the fragile nature of both the wafer and thin film based solar cells it is essential for the cells to be supported by a load carrying supporting member. This load carrying supporting member may be rigid, e.g. a glass plate rigid material, or a flexible material e.g. a metallic films and/or sheets or suitable plastic materials such as polyimides. A solar or photovoltaic cell module (hereafter referred to as a solar cell module) comprises a single solar cell or a planar assembly of interconnected solar cells supported by a load carrying supporting member. Solar cell modules are typically encapsulated to protect the cell from the environment. The supporting member of the solar cell module may be a top layer or superstrate which is transparent to sunlight i.e. positioned between the solar cells and a light source. Alternatively, the supporting member may be a back layer or substrate which is positioned behind the solar cells. Often solar cell modules comprise both a superstrate and a substrate. Typically a series of solar cell modules are interconnected to form a solar array which functions as a single electricity producing unit wherein the cells and modules are interconnected in such a way as to generate a suitable voltage in order to power a piece of equipment or supply a battery for storage etc.

In general, solar cell modules are made by electrically interconnecting individual solar cells on a superstrate or substrate and laminating the interconnected cells into an integral solar cell module. In addition to the support and protection provided by the aforementioned supporting superstrate and/or substrate the light-impinging surfaces of the cells are also generally protected from the environment (e.g. wind, rain, snow, dust and the like, by being covered with one or more encapsulant or barrier coating materials (Hereafter referred to as "encapsulant(s)").

Usually wafer based solar cell modules are designed using a superstrate which is transparent to sunlight fabricated from a material, usually in combination with a substrate and having one or more layers of encapsulant as a cell adhesive for adhering the cells to the superstrate and when present to the substrate. Hence, light passes through the transparent superstrate and adhesive before reaching the semi-conducting wafer. The superstrate, typically a rigid panel, serves to protect one side of the solar cell from potentially harmful environmental conditions and the other side is protected by the combination of several layers of encapsulants and a substrate.

A wide variety of materials have been proposed for use as solar cell module encapsulants. Common examples include films of ethylene-vinyl acetate copolymer (EVA), Tedlar® from E.I. Dupont de Nemours & Co of Wilmington Del. and UV curable urethanes. The encapsulants are generally supplied in the form of films and are laminated to the cells, and superstrate and/or substrate. Prior art examples include the lamination of solar cells using adhesives as exemplified in U.S. Pat. No. 4,331,494 and the application of an acrylic polymer and a weather resistant layer as described in U.S. Pat. No. 4,374,955. Solar cell modules have also been prepared by casting and curing acrylic prepolymers onto the solar cells as described in U.S. Pat. No. 4,549,033.

EP 0406814 and U.S. Pat. No. 6,320,116 both describe encapsulation systems for solar cell or photovoltaic systems. Kondo et al. (Solar Energy Materials and Solar Cells 49 (1997) pages 127 to 133) describe the use of a thermosetting organic liquid resin as a means of encapsulating amorphous silicon photovoltaic modules but do not clearly identify the resin used.

Typically in the prior art the encapsulants used are filmic and therefore the layers of encapsulant have to be laminated under heat and vacuum conditions which cause them to melt, bond to adjacent surfaces, and literally "encapsulate" the solar cells.

Currently existing methods for solar cell module encapsulation are usually carried out in a batch mode because of the lamination step which makes the entire process slow resulting in the fact that the overall cost of encapsulating the modules is high. In many instances, several layers of encapsulant may be applied using either the same or different encapsulant materials for different layers. An example of a prior art module is shown in FIG. 1 herein. For example a module may comprising a superstrate supporting a plurality of solar cells with a first layer of encapsulant which is transparent to sunlight, utilised as an adhesive, to adhere the superstrate to a series of interconnected solar cells. A second or rear layer of encapsulant may then be applied onto the first layer of encapsulant and interconnected solar cells. The second layer of encapsulant may be an additional layer of the same material as used for the first encapsulant, e.g. ethyl vinyl acetate (EVA) and/or may be transparent or any suitable colour. The substrate is present in the form of a rigid or, a stiff backskin to provide protection to the rear surface of the module. A wide variety of materials have been proposed for the substrate, which does not necessarily need to be transparent to light, these include the same materials as the superstrate e.g. glass but may also include materials such as organic fluoropolymers such as ethylene tetrafluoroethylene (ETPE), Tedlar®, or poly ethylene terephthalate (PET) alone or coated with silicon and oxygen based materials ($SiO_x$).

Usually a protective seal is provided to cover the edges of the module, and a perimeter frame made of aluminium or a plastic material is provided to cover the seal. The frame protects the edges of the module when the front cover is made of a fragile material such as glass. Hence, subsequent to lamination and application of the protective seal, the module is mounted in the frame. Frames suitable for use in combination with solar cell modules comprise mounting holes which are provided to enable easy mounting of the resulting framed module to a suitable object in the field. Typically the mounting process will be accomplished using any appropriate mounting systems e.g. by way of screws, bolts, nuts and the like.

Currently one method used to decrease solar cell module manufacturing costs involves the replacement of the metal, typically aluminium solar cell module frame with a polymeric material for both the substrate and the edging. For amorphous thin film silicon solar cell modules, polymeric frames made from moulded thermoplastic materials such as polyurethane are commonly used. These may be prepared by reaction injection moulding polyurethane to form a frame around an amorphous silicon cell module. Reaction injection moulding may be done in situ (i.e., on the module), this generally leads to a significant cost saving. However, this moulding process shows several disadvantages. For example, this process includes the use of a chemical precursor (e.g., isocyanate) which poses environmental hazards. This process also requires a mould, further adding to the overall manufacturing cost. The modules made by this process tend to be smaller because of the higher cost of the mould and the limited strength of the resulting polymeric frame. In this configuration, the encapsulant is still based on several layers of laminated thermoplastics such as EVA and a fluoropolymer such as ETFE copolymer. The only cost saving is derived from the cost reduction of the frame but potentially renders the resulting solar cell module more brittle.

Another problem with solar cell modules currently used in the industry is the fact that thermoplastic laminates are well known to have poor adhesive properties relative to glass. This problem whilst not always initially evident often leads to gradual delamination of a thermoplastic layer from glass surfaces in a solar cell over periods of prolonged weathering. The delamination process results in several negative effects on cell efficiency; such as it causes water accumulation in the encapsulant ultimately resulting in cell corrosion. These laminates also have a low UV resistance and as such discolour, generally turning yellow or brown over the lifetime of a solar cell, leading to a non-aesthetically pleasing module. Classically, a substantial amount of adhesive may often be required to reduce delamination effects and UV screens need to be incorporated in the module to decrease long-term discolouration.

For wafer type solar modules e.g. crystalline silicon wafer modules, one of the main problems is the cost of the materials used; for example, the substrate material is generally expensive. There are two widely used substrate materials, both of which tend to be expensive: EVA laminate and Tedlar®, referred to above, a polyvinyl fluoride (PVF) and the other widely used substrate material is glass in glass/cell/glass configuration.

It is also known that the cost of the encapsulant and the substrate materials, when required, represent a substantial fraction of the overall cost of each cell and/or module. There is therefore a long felt need to reduce the costs of encapsulating solar cells in order to reduce the overall cost of their manufacture. The inventors have identified that the overall cost per solar cell module may be reduced by the use of one or more liquid silicone encapsulants enabling the utilisation of a continuous encapsulation process which thereby eliminates several stages in the current solar cell module manufacturing process. The fact that the laminate encapsulants are replaced by a liquid encapsulant which hardens under infrared radiation or thermal cure reduces or eliminates the handling of laminate sheets and avoids the need for laminators, that increase both encapsulation batch time and cost. The present invention furthermore avoids the problems caused by the production of waste from lamination processes, and the resulting associated materials cost.

In accordance with a first aspect of the present invention there is provided a solar cell module comprising:—
  i) a rigid or flexible superstrate and/or substrate;
  ii) one or more solar cells, and
  iii) a cured liquid silicone encapsulant selected from the group of a hydrosilylation cure reaction product, a peroxide cure reaction product and a UV cure reaction product.

In the case where both a superstrate and substrate are present it is preferred that the solar cells have all their exposed surfaces disposed on either said superstrate or substrate.

The solar cell may be either a wafer or a thin film based and may be made from any suitable semi-conductor material such as crystalline or polycrystalline silicon or thin film silicon, e.g. amorphous, semi crystalline silicon, gallium arsenide, copper indium diselenide, cadmium telluride, copper indium gallium diselenide, mixtures including any one or more of the latter and the like. In the case of wafer based solar cells, preferably the wafer is polycrystalline or crystalline silicon. In the case of thin film solar cells, the thin film is preferably made from amorphous silicon (aSi), cadmium telluride or copper indium gallium diselenide. The solar cell may be any suitable type solar cell including simple wafer and thin layer solar cells but also split-spectrum cells and the like. The module may be any suitable type of solar cell module including concentrators etc.

Preferably, in respect of wafer based solar cell modules in accordance with the present invention the rigid or flexible superstrate and/or substrate comprise a rigid superstrate which is transparent to light.

Preferably, in the case of thin film solar cell modules, the rigid or flexible superstrate and/or substrate comprises a rigid or flexible substrate, such as for example glass or a flexible metal sheet.

The liquid silicone encapsulant in accordance with the invention preferably comprises:
  Component (A) 100 parts by weight of a liquid diorganopolysiloxane having at least two Si-alkenyl groups per molecule and a viscosity at 25° C. of from 100 to 15,000 nPa·s;
  Component (B) 20 to 50 parts by weight of a silicone resin containing at least two alkenyl groups;
  Component (C) a cross-linking agent in the form of a polyorganosiloxane having at least two silicon-bonded hydrogen atoms per molecule, in an amount such that the ratio of the number of moles of silicon-bonded hydrogen to the total number of moles of silicon-bonded alkenyl groups is from 0.1:1 to 5:1;
  Component (D) a hydrosilylation catalyst selected from platinum, rhodium, iridium, palladium or ruthenium based catalysts, but which is preferably a platinum based catalyst wherein the amount of platinum metal in said platinum-based catalyst is from 0.01 to 500 parts by weight per 1,000,000 parts by weight of component (A).

The proportions of components (A), (B), (C) and (D) may comprise any suitable amounts. The final viscosity of the resulting uncured composition may be, but is not essentially, able to self-level within a short period of time after having been dispensed. The preferred viscosity of the final composition is preferably from 100 to 10 000 mPa·s measured at 25° C., more preferably from 100 to 5000 mPa·s Component (A) is preferably a liquid diorganopolysiloxane, represented by the following average unit formula:

$$R_aSiO_{(4-a)/2}$$

Wherein each R is the same or different and is a monovalent hydrocarbon group, for example a linear or branched alkyl group such as methyl, ethyl, propyl, isopropyl t-butyl, and pentyl; an alkenyl group such as vinyl, allyl, or hexenyl; and an aryl group such as phenyl. "a" is a number with an average value between 1.8 and 2.3. Preferably, component (A) has a viscosity at 25° C. of from 100 to 10,000 mPa·s, a molecular structure which is substantially linear although may be partially branched and a relatively low molecular weight of from 10000 to 50000, more preferably from 15000 to 30000. Preferably, component (A) comprises alkenyl terminal groups.

Examples of component (A) include
a dimethylvinylsiloxy-terminated dimethylpolysiloxane,
a dimethylvinylsiloxy-terminated copolymer of methylvinylsiloxane and dimethylsiloxane,
a dimethylvinylsiloxy-terminated copolymer of methylphenylsiloxane and dimethylsiloxane,
a dimethylvinylsiloxy-terminated copolymer of methylphenylsiloxane, methylvinylsiloxane, and dimethylsiloxane,
a dimethylvinylsiloxy-terminated copolymer of diphenylsiloxane and dimethylsiloxane,
a dimethylvinylsiloxy-terminated copolymer of diphenylsiloxane, methylvinylsiloxane, and dimethylsiloxane, or any suitable combination of the above Component (3) is a Silicone resin containing at least two alkenyl groups comprising $SiO_{4/2}$ units (also known as Q units) and units selected from $R'SiO_{3/2}$ (also known as T units), $R'_2SiO_{2/2}$, and $R'_3SiO_{1/2}$ units, where each $R'$ may be the same or different and is R or a hydrogen atom. It is preferred to disperse component (B) in a suitable amount of component (A) or a solvent to ensure ease of mixing with bulk of component (A). Any suitable solvents may be used such as for example aromatic solvents such as toluene and xylene, ketones such as methyl isobutyl ketone, alcohols such as isopropanol and non-aromatic cyclic solvents such as hexane. Typically, when a solvent is used, xylene is preferred.

Component (C) is a cross-linking agent in the form of a polyorganosiloxane having at least two silicon-bonded hydrogen atoms per molecule and has the following average unit formula:

$$R^i{}_bSiO_{(4-b)/2}$$

where each $R^i$ may be the same or different and is hydrogen, an alkyl group such as methyl, ethyl, propyl, and isopropyl or an aryl group such as phenyl and tolyl. Component (C) may have a linear, partially branched linear, cyclic, or a net-like structure.

Examples of the aforementioned organopolysiloxane include one or more of the following:—
a trimethylsiloxy-terminated polymethylhydrogensiloxane,
a trimethylsiloxy-terminated copolymer of methylhydrogensiloxane and dimethylsiloxane,
a dimethylhydrogensiloxy-terminated copolymer of methylhydrogensiloxane and dimethylsiloxane,
a cyclic copolymer of methylhydrogensiloxane and dimethylsiloxane,
an organopolysiloxane composed of siloxane units expressed by the formula $(CH_3)_3SiO_{1/2}$, siloxane units expressed by the formula $(CH_3)_2HSiO_{1/2}$, and siloxane units expressed by the formula $SiO_{4/2}$,
an organopolysiloxane composed of siloxane units expressed by the formula $(CH_3)_2HSiO_{1/2}$, siloxane units expressed by the formula $CH_3SiO_{3/2}$,
an organopolysiloxane composed of siloxane units expressed by the formula $(CH_3)_2HSiO_{1/2}$, siloxane units expressed by the formula $(CH_3)_2SiO_{1/2}$, and siloxane units expressed by the formula $CH_3SiO_{3/2}$,
a dimethylhydrogensiloxy-terminated polydimethylsiloxane,
a dimethylhydrogensiloxy-terminated copolymer of methylphenylsiloxane and dimethylsiloxane, and
a dimethylhydrogensiloxy-terminated copolymer of a methyl (3,3,3-trifluoropropyl) siloxane and dimethylsiloxane.

Preferably, the viscosity of the cross-linking agent (C) at 25° C. is in a range of from 2 to 100,000 mPa·s. It is recommended that component (C) be added in an amount such that the mole ratio of silicon-bonded hydrogen atoms in the cross-linking agent (C) to the mole number of alkenyl groups in component (A) is in the range of from 0.1:1 to 5:1, more preferably it is in the range of from 0.8:1 to 4:1. If the above ratio is lower than 0.1:1, the density of cross-linking will be too low and it will be difficult to obtain a rubber-like elastomer. A ratio having an excess of Si—H groups (i.e. >1:1) is preferred to enhance adhesion between the superstrate/substrate e.g. glass and the encapsulant.

Component (D) is a hydrosilylation (addition cure) catalyst may comprise any suitable platinum, rhodium, iridium, palladium or ruthenium based catalyst. However preferably component (D) is a platinum based catalyst. The platinum-based catalyst may be any suitable platinum catalyst such as for example a fine platinum powder, platinum black, chloroplatinic acid, an alcoholic solution of chloroplatinic acid, an olefin complex of chloroplatinic acid, a complex of chloroplatinic acid and alkenylsiloxane, or a thermoplastic resin that contain the aforementioned platinum catalyst. The platinum catalyst is used in an amount such that the content of metallic platinum atoms constitutes from 0.1 to 500 parts by weight per 1,000,000 parts by weight of component (A). A hydrosilylation or addition cure reaction is the reaction between an Si—H group (typically provided as a cross-linker) and an Si-alkenyl group, typically a vinyl group, to form an alkylene group between adjacent silicon atoms (=Si—$CH_2$—$CH_2$—Si=).

The composition may also comprise one or more curing inhibitors in order to improve handling conditions and storage properties of the composition, for example acetylene-type compounds, such as 2-methyl-3-butyn-2-ol, 2-phenyl-3-butyn-2-ol, 3,5-dimethyl-1-hexyn-3-ol, 1-ethynyl-1-cyclohexanol, 1,5-hexadiene, 1,6-heptadiene; 3,5-dimethyl-1-hexen-1-yne; 3-ethyl-3-buten-1-yne and/or 3-phenyl-3-buten-1-yne; an alkenylsiloxane oligomer such as 1,3-divinyltetramethyldisiloxane, 1,3,5,7-tetravinyltetramethyl cyclotetrasiloxane, or 1,3-divinyl-1,3-diphenyldimethyldisiloxane; a silicon compound containing an ethynyl group such as methyltris (3-methyl-1-butyn-3-oxy) silane; a nitrogen-containing compound such as tributylamine, tetramethylethylenediamine, benzotriazole; a similar phosphorus-containing compound such as triphenylphosphine; as well as sulphur-containing compounds, hydroperoxy compounds, or maleic-acid derivatives.

The aforementioned curing inhibitors are used in an amount of from 0 to 3 parts by weight, normally from 0.001 to 3 parts by weight, and preferably from 0.01 to 1 part by weight per 100 parts by weight of component (A). Most preferable among the curing inhibitors are the aforementioned acetylene-type compounds, which demonstrate the best balance between storage characteristics and speed of curing when they are used in a combination with aforementioned component (D).

Where required one or more adhesion promoters may also be used to enhance the adhesion of the encapsulant to a superstrate and/or substrate surface. Any suitable adhesion promoter may be utilised. Examples include
vinyltriethoxysilane,
acrylopropyltrimethoxysilane,
alkylacrylopropyltrimethoxysilane
Allyltriethoxysilane,
glycidopropyltrimethoxysilane,
allylglycidylether hydroxydialkyl silyl terminated methylvinylsiloxane-dimethylsiloxane copolymer, reaction product of hydroxydialkyl silyl terminated methylvinylsiloxane-dimethylsiloxane copolymer with glycidopropyltrimethoxysilane; and, bis-triethoxysilyl ethylene glycol (reaction product of triethoxysilane with ethylene glycol).

Preferred adhesion promoters are
i) hydroxydialkyl silyl terminated methylvinylsiloxane-dimethylsiloxane copolymer,
ii) reaction product of hydroxydialkyl silyl terminated methylvinylsiloxane-dimethylsiloxane copolymer with glycidopropyltrimethoxysilane; and
iii) bis-triethoxysilyl ethylene glycol
iv) a 0.5:1 to 1:2, preferably about 1:1, mixture of (i) and a methacrylopropyltrimethoxysilane Anti-soiling additives may be utilised, where required to prevent soiling when the solar cells are in use, particularly preferred are fluoroalkene or a fluorosilicone additives that has a viscosity of 10000 mPa·s such as:—fluorinated silsesquixoanes, e.g. dimethylhydrogensiloxy terminated trifluoropropyl silsesquioxane, hydroxy-terminated trifluoropropylmethyl siloxane, hydroxy-terminated trifluoropropylmethylsilyl methylvinylsilyl siloxane, 3,3,4,4,5,5,6,6,7,7,8,8-Tridecafluorooctyltriethoxysilane, hydroxy-terminated methylvinyl, trifluoropropylsilaxane, and dimethylhydrogensiloxy-terminated dimethyl trifluoropropylmethyl siloxane Preferably, the anti-soiling additive is present in an amount of from 0 to 5 parts by weight, more preferably 0 to 2 parts by weight and most preferably 0 to 1.5 parts by weight. Preferably when the encapsulant is used both in the absence of the adhesive layer referred to below the anti-soiling additive is included in the encapsulant composition as well as when used in combination with the adhesive layer.

Other additives that enhance the physical properties may be utilised in the composition. One particular example is the inclusion of a fire retardant. Any suitable fire retardant or mixture of fire retardants may be used providing they do not negatively affecting the other physical properties of the encapsulant composition. Examples include alumina powder, or wollastonite as described in WO 00/46817. The latter may be used alone or in combination with other fire retardants or a pigment such as titanium dioxide. In cases where the encapsulant need not be transparent to light, it may comprise a pigment.

In one aspect of the present invention the solar cell module comprises thin film solar cells. Preferably, a solar cell module comprising thin film solar cells requires a single layer of encapsulant. In the case where a single layer of encapsulant is utilised the silicone encapsulant is designed to be hard and scratch resistant and thereby is designed to function as both an adhesive/top coat and avoids the need for an expensive substrate of the type generally utilised in the prior art. Preferably, solar cell modules comprising a single layer of encapsulant incorporate the aforementioned anti-soiling additive.

In the case when a single layer of encapsulant is utilised it is preferred that component (C) of the formulation has an excess of Si—H groups, i.e. the ratio of the number of moles of silicon-bonded hydrogen to the total number of moles of silicon-bonded alkenyl groups is preferably 0.8:1 to 5:1, more preferably >1:1 and most preferably from 1:1 to 4:1.

Hence in the case of a solar cell module with a single layer of encapsulant in accordance with the present invention, Component (A) preferably is a high molecular weight polymer, component (B) is present in an amount of from 30 to 50 parts by weight of a silicone resin containing at least two alkenyl groups and Component (C) is a cross-linking agent in the form of a polyorganosiloxane having at least two silicon-bonded hydrogen atoms per molecule, in an amount such that the ratio of the number of moles of silicon-bonded hydrogen to the total number of moles of silicon-bonded alkenyl groups in component is from 0.8:1 to 5:1 and more preferably from 1:1 to 4:1. Furthermore, the composition comprises an anti-soiling additive.

Any suitable process may be used to prepare the uncured liquid silicone encapsulant; for example, component (B) may be premixed with component (A) and component (C) and then co-cross-linked in the presence of a low level of platinum catalyst to form a tough polymer network. A small amount of a catalyst inhibitor such as ethylhexynol may be added to prolong the bath time of the encapsulant. When heated above 90° C., the mixture initially forms a non-transparent two-phase system due to the presence of the anti-soiling additive and then becomes highly transparent. To ensure the long lasting bonding of the encapsulant to all adjacent surfaces, a small amount of adhesion promoter is preferably use. It is believed that the adhesion promoter migrates to the interface of the topcoat and reacts irreversibly with adjacent surfaces. This strong adhesion allows the module to function in wide range of temperatures from ambient temperature to extremes without delaminating.

The single layer encapsulant is designed to have a required abrasion resistance to prevent further damage that may occur during transportation or in field usage. It is tough enough to serve also as the substrate protecting the cell.

The combination of encapsulant and topcoat is designed to replace multiple layers and material chemistry of the classical configuration (EVA and fluoropolymer laminate) by two layers based on one core chemistry. The topcoat preferably covers the entire cell interconnects; it functions as an outer layer i.e. as an environmentally protecting layer.

Component (B) of the composition as hereinbefore described is provided because silicone resins of this type impart outstanding UV resistance to the encapsulant and therefore there is no need for the inclusion of one or more UV screen additives which in the case of most prior art formulations was typically essential. The cured liquid silicone encapsulant of the type described in the present invention exhibits long term UV & visual light transmission thereby allowing the maximum amount of light to reach solar cells.

Whilst the UV resistance capabilities of silicone based compositions is well known the commercial exploitation of such formulations have been limited by high total cost and a lack of suitable process to dispense a liquid encapsulation.

In the case of thin film solar cell modules the inventors have found that the encapsulant as hereinbefore described is adequate to replace the often several layers of encapsulant and avoids the need for a substrate. The encapsulant is located between e.g. a glass plate superstrate and the solar cell and its primary function is to protect the solar cell against mechanical stress arising from temperature changes, and to adhere the solar cell to the superstrate.

However, particularly in the case of wafer type solar cell modules it has been identified that in some instances an optional adhesive layer comprising a further liquid silicone encapsulant may be utilised for the adhesion of the wafer type solar cells onto the load bearing support, typically a superstrate.

The liquid silicone encapsulant utilised as the intermediate adhesive layer (henceforth referred to as the adhesive) is preferably substantially the same basic formulation as the single layer encapsulant described to above and preferably comprises:

Component (Ai) 100 parts by weight of a liquid diorganopolysiloxane having at least two Si-alkenyl groups per molecule and a viscosity at 25° C. of from 100 to 10,000 mPa·s;

Component (Bi) 20 to 40 parts by weight of a silicone resin containing at least two alkenyl groups;

Component (Ci) a cross-linking agent in the form of a polyorganosiloxane having at least two silicon-bonded hydrogen atoms per molecule, in an amount such that the ratio of the number of moles of silicon-bonded hydrogen to the total number of moles of silicon-bonded alkenyl groups is from 0.1:1 to 1:1;

Component (Di) a hydrosilylation catalyst selected from platinum, rhodium, iridium, palladium or ruthenium based catalysts, but which is preferably a platinum based catalyst wherein the amount of platinum metal in said platinum-based catalyst is from 0.01 to 500 parts by weight per 1,000,000 parts by weight of component (Ai).

The proportions of components (Ai), (Bi), (Ci) and (Di) may comprise any suitable amounts. The final viscosity of the resulting uncured composition may be, but is not essentially, able to self-level within a short period of time after having been dispensed. The preferred viscosity of the final composition is preferably from 100 to 2000 mPa·s measured at 25° C., more preferably from 500 to 1000 mPa·s.

Preferably, the viscosity of component (Ai) of the adhesive is lower than the viscosity of component (A) of the aforementioned encapsulant. Preferably when both encapsulant and adhesive are utilised, the encapsulant comprises a resin fraction of between 20% to 90% by weight, preferably between 25% to 70% and more preferably between 30-60% and the adhesive comprises a resin fraction of from 20-30% by weight.

The adhesive may also comprise any one or more of the optional additives described with respect to the encapsulant formulation. Preferably the adhesive layer comprises a suitable adhesion promoter, most preferably one of the adhesion promoters listed above with respect to the encapsulant composition.

The adhesive composition may be cured by any suitable process, for example component (Bi) may be premixed with components (Ai) and (Ci) and then co-cross-linked in the presence of platinum catalyst to form a tough network. Preferably, a small amount of a catalyst inhibitor, such as for example ethylhexynol, is added to allow a prolonged bath time of the material. To ensure a long lasting bonding interaction between the encapsulant and all adjacent surfaces, a small amount of adhesion promoter, typically an alkoxysilane, is added and the ratio of Si—H bonds to Si-alkenyl bonds is lower than 1:1, such as for example 0.6:1. It is believed that the adhesion promoter migrates to the interface of the encapsulant and reacts irreversibly with adjacent surfaces. This strong adhesion allows the module to function over a wide range of temperatures without or substantially without delaminating. The excess of alkenyl groups also helps the bonding/adhesion of the intermediate layer of adhesive with the encapsulant which is in this case functioning as a topcoat.

Both the encapsulant and, where utilized, the adhesive provide homogeneous and transparent silicone films that maintains a high flexibility due to the presence of the linear or substantially linear polymers of component (A). The encapsulant, when cured, has a higher tear resistance than the adhesive. The anti-soiling additives are added to the encapsulant, to increase the soil resistance of the material and are used in amounts which will not noticeably negatively affect the abrasion resistance properties thereof. In a composition such as that of the encapsulant of the present invention, the anti-soiling additives are believed to migrate and spread rapidly at the silicone/air interface making a low surface energy surface but remain chemically bonded to the silicone matrix. The soil accumulation on the outwardly facing side (at the interface with the environment) of the encapsulant is inversely proportional to the surface energy, which is related to the level of anti-soiling additives on the surface.

In use when anti-soiling additives are included in the encapsulant composition; first, a surface phase separation occurs; the anti-soiling additive migrates to the surface and then reacts with the cross-linker giving a fluorine-covered surface. The platinum concentration at the surface increases due to inhibitor evaporation, leading to a gradient cure rate of the film from the surface to the bulk. The overall result providing a much harder surface and smoother bulk material that allows stress relaxation interface between the glass and the wafer.

In one aspect, the invention features a transparent encapsulant formed of a silicone composition that provides good adhesive properties to the front glass and to the solar cells. The encapsulant plays the role of a potting material, showing a good adhesion to the interconnected solar cells, to the connecting wires and to the superstrate e.g. a glass plate (wafer modules). The adhesion of the encapsulant to solar cells requires a good wetting of the cell and on an occasion, it was found desirable to provide such wetting by means of the adhesive, which preferably has a lower viscosity than the encapsulant.

In the case of peroxide cure encapsulant product any suitable liquid silicone composition may be used. Typically peroxide catalysts are used for free-radical based reactions between siloxanes comprising:—

≡Si—$CH_3$ groups and other ≡Si—$CH_3$ groups; or

≡Si—$CH_3$ groups and ≡Si-alkenyl groups (typically vinyl); or

≡Si-alkenyl groups and ≡Si-alkenyl groups. For peroxide cure components A and B above would preferably be retained with a suitable peroxide catalyst and any or all of the additives described above (with the exception of the cure inhibitors which are specific to hydrosilylation type catalysis) may be utilised. Suitable peroxide catalysts may include but are not restricted to 2,4-dichlorobenzoyl peroxide, benzoyl peroxide, dicumyl peroxide, tert-butyl perbenzoate.

In the case of UV cure systems any suitable liquid silicone polymer may be utilised together where appropriate with a UV photoinitiator. For UV cure systems any or all of the additives described above (with the exception of the cure inhibitors which are specific to hydrosilylation type catalysis) may be utilised Any other suitable cure system for curing organopolysiloxanes may be utilised providing the uncured organopolysiloxane composition used is suitable for application in accordance with any one of the processes described below.

The inventors have also found a new way of passivating the surface of a solar cell and/or photovoltaic cell which may be encapsulated by any system i.e. using the composition as described in the present invention or the prior art processes and lamination techniques. The coating of the cell surface with a trialkoxysilane results in a primer or passivating layer which has good adhesion to the cell surface and typically to the encapsulant used. It will passivate the surface and thereby increase the wetting of the cell(s) in order to reduce or avoid problems with bubble formation between the cell and the encapsulant and/or adhesive. It will also protect the cell after encapsulation from water ingress and corrosion. The chosen silane may be applied as a precoating onto the solar cell(s) or may be added in a suitable concentration in the encapsulant composition. The pre-coating may comprise the silane alone or a solution of the silane in a solvent such as an alcohol, the latter of which is allowed to evaporate after application. Typically, the layer of the passivation coating might be as small as 2 μm thick. Most preferably the passivation layer is provided on wafer type solar cells. Preferably the silane has the formula:—

$$(R^1O)_3SiR^2$$

wherein $R^1$ is an alkyl group comprising 1 to 6 carbon atoms, $R^2$ is selected from the group of an alkoxy group comprising 1 to 6 carbon atoms, an alkyl group comprising 1 to 6 carbon atoms an alkenyl group comprising 1 to 6 carbon atoms, an acrylic group or an alkyl acrylic group. Preferably, the tri-alkoxysilane is for example, a trimethoxysilane or triethoxysilane, most preferably methacrylopropyltrimethoxysilane.

Advantages of the solar modules encapsulated using the liquid silicone encapsulant described above include:—
   i) A reduction of the Total cost-in-use of modules i.e. a reduction in the total cost taking all the parameters including material, application process, quantity of material per square meter);
   ii) Module Durability—modules made using the compositions described in the present invention are both enhance efficiency of manufacture and reduce problems of discoloration after ageing due to UV exposure.
   iii) Due to the physical properties of the liquid silicone encapsulant fire resistant properties are significantly improved over prior art modules.
   iv) The application of the encapsulant and, where used, the adhesive by any chosen method using the compositions described in the present invention, e.g. curtain coating is undertaken at room temperature (although some heating may be utilised).

In another aspect of the present invention there is provided a continuous method of encapsulating solar cell modules using the liquid silicone encapsulant material described above.

The current standard industry process generally utilizes an EVA (ethyl vinyl acetate) thermoplastic encapsulant and a laminatable backing material such polyester/Tedlar® and the cell or array of cells/module is prepared using a lamination technique. Typically, a suitable laminator is used to laminate the following "sandwich" of layers.
   1) Glass superstrate,
   2) EVA,
   3) solar cell series,
   4) EVA, and
   5) Substrate in the form of a suitable backing material The standard process uses the laminator apparatus to melt the layers of the "sandwich" at a temperature in the region of 140° C. (actual temperature used is determined in view of the actual composition being laminated) under vacuum for about 20 minutes per module. After lamination and the removal of waste material, surplus to requirements, the next step of the batch process is usually the application a protective seal is provided to cover the edges of the module, followed by the framing of the module in the perimeter frame, typically made of aluminium or a plastic material and discussed previously. The overall operation is carried out in a batch mode and is typically slow and very labour intensive.

In order to simplify the description around the process in accordance with the present invention the process will be described for both thin film and wafer type solar cell modules with respect to the cells being supported on a glass supporting superstrate or substrate, but it is to be understood that the process of the present invention can be utilised for any suitable module composition by merely adapting the process to the needs of the module in question.

In the present invention, in the case of thin film solar cells on a glass substrate or superstrate, a transparent encapsulant layer is sprayed, coated or dispensed uniformly on a thin film solar cell module by way of any suitable type of dispensing equipment such as for example curtain coaters, spray devices, die coaters, dip coaters, extrusion coaters, knife coaters and screen coaters and the like, but preferably by means of a curtain coater and the resulting module is then cured thermally or by infrared radiation, a suitable heating or IR radiation source for example a continuous oven or an in-place heating means such as an oven or hot plate or the like, preferably a continuous oven. The spraying, coating or dispensing step may be undertaken at any suitable temperature but preferably is undertaken at a temperature of from room temperature, e.g. about 25° C. to about 75° C., although room temperature is preferred.

Typically for thin film solar cell modules the inventors have found that no additional adhesive is required as the encapsulant bonds sufficiently well directly with the solar cell and substrate/superstrate. However, for wafer based solar cells, an adhesive layer is required to adhere the solar cell, (i.e. the wafer) to the superstrate or substrate. Whilst this may be in the form of a layer of the encapsulant as described above, the adhesive described above is preferably used.

The liquid encapsulant and, where used the adhesive are both designed to cure and therefore harden in a well-defined thickness when submitted to infrared or thermal radiation. The use of encapsulant, and where required the adhesive, enables the user to operate a continuous process in which a liquid silicone encapsulant may be applied onto solar cells by way of any suitable type of dispensing equipment such as for example curtain coaters, spray devices die coaters, dip coaters, extrusion coaters, knife coaters and screen coaters and the like. The pre and post encapsulated modules may be fed continuously using a conveyor for planar and rigid superstrates or substrates such as glass or fed in a roll to roll process for flexible superstrates or substrates such as stainless steel foils.

One major advantage of the process in accordance with the present invention is that the encapsulant is therefore applied to the cell surface without or substantially without air bubble entrapment, a major problem under current processes because air bubbles are believed to retain moisture in high humidity conditions and in use solar cells can be subjected to huge temperature variations. The presence of moisture is detrimental to solar cell modules as it condenses into liquid water which may induce local corrosion of metallic contacts, on solder or on solar cells and furthermore may cause early delamination of the modules.

In the case of interconnecting wafer type solar cells, the adhesive as hereinbefore described is preferably sprayed, coated or dispensed uniformly onto the back of a superstrate or substrate, e.g. a glass plate by means of curtain coaters, spray devices, die coaters, dip coaters, extrusion coaters, knife coaters and screen coaters and the like, preferably a curtain coater. Then the interconnected solar cells are deposited onto/in to the uncured adhesive. The adhesive is then cured/hardened thermally or by infrared radiation in such a way that the adhesive fixes the interconnected solar cells in a predefined position on the superstrate/substrate, by a suitable heating or IR radiation source for example a continuous oven or an in-place heating means such as an oven or hot plate or the like. Then an amount of encapsulant as described hereinbefore is uniformly applied to totally encapsulate the whole module by means of curtain coaters, spray devices, die coaters, dip coaters, extrusion coaters, knife coaters and screen coaters and the like, preferably a curtain coater and the resulting module is then cured/hardened thermally or by infrared radiation using a suitable heating or IR radiation source for example a continuous oven or an in-place heating, preferably a continuous oven.

Alternatively for wafer based solar cell systems a sufficient amount of encapsulant or if used adhesive is sprayed, coated or dispensed uniformly onto a glass superstrate/substrate and then the interconnecting solar cells are carefully immersed into a further amount of the same material and subsequently the resulting module is cured and hardened either thermally or by infrared radiation and where required a top-coat of encapsulant is sprayed, coated or dispensed (as described above) uniformly onto the cured adhesive and subsequently is cured and hardened either thermally or by infrared radiation as described above.

In one aspect of the present invention, the frame or edge sealing material may be applied to the substrate/superstrate before encapsulation and not after completion of the encapsulation process via the laminating processes of the prior art. This forms a guide for where the encapsulant and/or adhesive needs to be applied in liquid form.

Preferably the application of both encapsulant and adhesive may be carried out at about room temperature but some heating may be utilised up to e.g. a temperature of 75° C., preferably no greater than 50° C. in order to reduce the viscosity of the encapsulant or adhesive being applied on to the module.

Preferably, the electrical leads in a module are treated using either of the above suggested methods are protected against coating with encapsulant and/or if used adhesive. The protected leads may be further bonded into an electrical junction box on the substrate or back skin material to form an integral seal. The liquid silicone coatings may be sealed and inserted into a metal, thermoplastic or elastomeric frame which also provide additional protection against water ingress at the edge of the panel. However, it was identified that with a silicone encapsulant in accordance with the present invention such a frame was not necessarily required unlike for solar cell modules prepared by the prior art lamination type processes.

One very important aspect when compared to prior art lamination based processes is that the entire process in accordance with this aspect of the invention may be automated into an integrated assembly line with process control and as such is a significantly less labour intensive.

In a preferred embodiment of the process in accordance with the present invention there is provided a continuous process using one or more means of coating the encapsulant and adhesive (where used) such as curtain coaters, spray devices and die coaters dip coaters, extrusion coaters, knife coaters and screen coaters and the like, although curtain coaters are preferred followed by an appropriate curing step, typically using a thermal or IR oven.

This process may be used for both organic and silicone systems provided the viscosity of the coatings involved are suitable for use in combination with the means of applying the coating such as a curtain coater, although the process is preferably used in combination with encapsulant and adhesive formulation of the type described herein. Hence, preferably the viscosity of the uncured composition is no greater than 50000 mPa·s and most preferably no greater than 40000 mPa·s.

The preferred means of applying encapsulant and where required adhesive is by means of a curtain coater. Curtain coating is a process for applying a thin layer of liquid onto a solid material. Curtain coating machines are adapted to disperse liquid at a controlled rate over the width of its coating head onto a target (in the case of this application solar cell modules). The resulting wide, thin flow of liquid resembles a "curtain" hence the name "Curtain Coater." By passing the target (the solar cell modules) under the curtain of liquid at a predefined constant speed an even layer of liquid is deposited on the target (the solar cell modules). The ability of the user to control both the flow rate of the liquid and the speed of the target through the curtain of liquid a very accurate thickness of the coat is obtained.

Encapsulant or adhesive is initially retained in a reservoir tank, and when required is pumped from the tank, through a filter to coating head. The coating head may be either pressurised or non-pressurised depending on the viscosity of the coating being used (but in the present invention will usually be pressurized due to the viscosity of the encapsulant and adhesive when used. The encapsulant or adhesive flows through a dye in the coating head to form a 'curtain' of liquid under the effects of gravity. The Solar cell module to be coated is transferred along an in-feed conveyor, through the curtain of material, and onto an out-feed conveyor. Preferably the 'curtain' of encapsulant or adhesive is wider than the solar cell modules being coated so that all excess material falls through a gap between the in-feed and out-feed conveyors into a collection trough, and flows back to the feed tank, thereby avoiding any unnecessary waste.

The feed tank is typically deep and constructed with baffles, so that the encapsulant or adhesive must follow a "tortuous" path, thus allowing time for any entrained air to escape before getting to the pump suction.

A curtain coater is generally used for processes involving much less viscous liquids and it was imperative for the process of the present invention that the curtain coater used did not cause frothing and or bubbling. Several adjustments were required in the stock equipment to handle liquids of the viscosities of the encapsulant and adhesive described in the present invention. These were mainly directed to reducing the amount entrained air in the system to minimise the likelihood of the encapsulant and adhesive where used to foam or retain air bubbles. The curtain coater was preferably fitted with high powered pumps as the standard diaphragm pumps cannot be used since they introduce air into the system and would not be practical for application of the liquid encapsulant which may have a relatively high viscosity for a liquid of up to e.g. 10.000 mPa·s.

Preferably, the curtain coater has a centre feed system. This is because whilst lower viscosity liquid can be fed from any position on the coater head, but as the viscosity of the liquids utilised is higher than normally expected for use with this type of coater resulting in the need for longer times than normal being required for levelling the encapsulant and/or adhesive in the modules.

Preferably, the curtain coater feeder head utilises surface feed to avoid the entrainment of air. This is because whilst lower viscosity liquids of the type typically applied by curtain coaters are fed in any submerged depth position (z dimension) from the bottom to the top of the coater head tank, normally it is fed in a submerged manner to control splashing.

Preferably, the curtain coater has an anti-splash "pan" at the bottom of the curtain fall. This is provided in the form of a rolled metal pan which is provided to contribute to the laminar flow into the discharge and help prevent entrained air.

Preferably the Feed tanks are preferably both larger (overall capacity) and taller than normal feed tanks used for standard curtain coaters, to allow entrained air bubbles to rise to the surface of the tank according to Stokes law, and again help reduce the entrained air.

Preferably the normal operating speed of the curtain coater may be lowered as compared to prior art curtain coaters. This is preferable because the lower operating speed range of the coater conveying system in order to allow better speed control of the speed of feeding the glass superstrates and/or substrates through the curtain coater, thereby providing better control curtain thickness.

Preferably, the curtain coater comprises a plurality of several curtain guides to the coater head to control the width of the curtain and/or allow the use of a multiple series of curtains. This provided coating flexibility and permitted the use of the same coating equipment for the coating of many different sizes of solar modules and arrays and the like.

Preferably, the curtain coater comprises a long return pipe and coalescer to remove gross bubbles from the system.

The curtain coater may also optionally comprise a heating system to heat the liquid as it approaches the curtain. Heating the encapsulant and adhesive when used to about 50° C., has the advantage of reducing the viscosity and enhances the probability of any microscopic bubbles present in the composition to be applied to rise to the surface.

Preferably the encapsulant and where used adhesive is de-aired prior to coating. Any suitable de-airing process may be utilised, e.g. by vacuum but preferably the curtain coater is provided with a semi-continuous vacuum stripper to de-air liquid before feeding it into or back into the coater head.

Preferably a multi-axis robot, (preferably six axes) may be integrated into the system for automating the accurate positioning of the solar cell modules on the in-feed conveyor belt and for accurately inserting/placing a solar cell or series of interconnected solar cells in position on the substrate or superstrate. This is particularly preferred in the case of wafer based solar cell systems where positioning of the cell on the superstrate or substrate is particularly critical. Any suitable robot may be utilised. The robotic gripper for holding and manipulating the solar cells or solar cell modules (i.e. the device attached to the mounting arm of the robot that will manipulate the solar cells or solar cell modules) may be of any suitable type but is preferably a series of vacuum suction cups adapted to hold the solar cells or solar cell modules in a flat (typically horizontal) plane.

In the case of an interconnected series of solar cells the gripper plate preferably has at least one vacuum cup per cell to avoid any stress on the tabs over, under, and between the cells. Typically for a single solar cell a single vacuum cup is utilised pulling the cell upward to four Teflon pins that determined an exact position. Typically for each solar cell, one or two small vacuum cups are utilized, pulling the solar cell upward to a positioning stops or pins that determine the exact position of the cell relative to the substrate or superstrate and enable exact placement of the cell on the substrate or superstrate.

The robot may for example pick up these a solar cell or series of interconnected solar cells from a fixed position and then place them into a thin liquid silicone layer on a superstrate or substrate (a glass plate). The glass plate may be edged with a cured sealant dam to hold the liquid in place. The glass plate may be mounted on top of a special near-IR oven that was fabricated to cure the liquid as the cells were held in place by the robot. The robot was adapted to manipulate the cells so that the best wetting method could be determined. In general, in the case of a single solar cell one edge of the solar cell was placed into the liquid and the remainder of the solar cell was lowered at a predetermined speed and angle to allow a meniscus of liquid to gradually flow over and wet the cell. Preferably the robot comprises a servomotor such that the speed of insertion of the solar cell is gradually decreased as the angle of the cell into the liquid became closer to the horizontal. In the case of a four cell array being placed edgewise, that is, with the aligned edge of all four cells forming the turning point, the cells were applied without bubble formation.

Any suitable oven may be utilised for curing applied layers of encapsulant and adhesive, continuous ovens are particularly preferred for curing applied layers of encapsulant. The continuous ovens may comprise short wave IR emitters (wavelength 1.2 to 1.4 µm), medium wave IR emitters (wavelength 1.4 to 2.7 µm) but preferably comprise medium wave emitters and the temperature in the oven will be optimised for the coating concerned but will typically be in the region of from about 120 to about 200° C. Preferably in the cases when an adhesive layer is utilised the module containing a solar cell or series of interconnected solar cells is held in place by means of the robot and cured in situ using any appropriate heating means such as a static oven or hot plate at a temperature of in the region of between 150 and 250° C.

A process for the application of both adhesive and encapsulant may for example comprise the following steps:

1) a suitable framing or sealing material is applied to a cleaned glass substrate or superstrate panel, preferably this takes place on an XY table onto which the plate had been previously positioned. The framing material is utilized to protect the edges of the panel and importantly provides a moisture barrier, and serves as a dam to contain the liquid encapsulant and where used adhesive prior to cure.

2) The resulting framed glass panel is conveyed through a continuous oven to fully cure the framing or sealing material.

3) The panel with the cured framing material is conveyed through a means of applying a layer of adhesive (preferably by means of a curtain coating (although any of the other referred to above may be utilised) operation). Preferably a layer of 150 to 1000 g/m, more preferably a layer of about 400 µm of adhesive material is applied in a very even coat.

4) If required the multi-axis robot may pick up a solar array (of interconnected solar cells) using, for example, a vacuum cup gripper, and then dip coats the solar array into a trialkoxy silane primer which is adapted to protect the cells against moisture. This primer also passivates the solar cell surface to assist in the avoidance of bubble formation during the curing process of the adhesive.

5) In the case where step 4 occurs the silane treated interconnected series of solar cells is then dried preferably by use of the robot. The robot then places the primed series of solar cells onto the framed panel, and into the layer of adhesive, using for example a slow six axis motion wherein in such cases a final, very accurate placement of the cells occur provided by a seventh axis on the gripper. Preferably this placement is done on an extremely flat "engineered" table that provides very accurate repeatability of placement. This table solves the many tolerance issues inherent in the glass and the solar cells. Preferably, this engineered table has a built-in heater that cures the adhesive layer within a few minutes and thus fixes the cells into a permanent position after which the robot is adapted to release the vacuum and the panel moves to the next step. However, alternatively the glass/cell/adhesive combination may be cured in a continuous oven.

The resulting post-cured panel "assembly" is then conveyed through a second curtain coater where a layer of from 20 μm to 1200 μm, preferably between 50 μm to 1000 μm, more preferably between 200 μm to 700 μm even more preferably 400 μm to 800 μm and most preferably 400 μm to 700 μm of the encapsulant is applied in a very even coat.

The module having had the encapsulant applied is then conveyed through a suitable continuous (e.g. convective/IR) oven where the encapsulant cures into a smooth tough backing material.

The final framed panel is then conveyed into a staging area which is similar and may even be the same as for existing systems where the electrical junction box is attached, and the panel is either packaged or progresses, where required, to a framing step. The framing material used is a thermoplastic or other suitable damping material also helps in this step because the cured framing material is bolted into an aluminium profile without any "squeeze out". This squeeze out of excess frame protection material is a problem with the double sided tape or sealant that is currently used in the industry, since it requires trimming and glass cleaning.

The entire process in accordance with the present invention is an automated assembly line, or continuous unit-operation manufacturing, using electronic process control such as PLC. There are sensors, conveyors, limit switches and buffering areas (for any mis-matches in rates of particular unit-operations). Preferably, the continuous process of the present invention provides one linear meter of panel per minute which is a significant improvement over the current production speed.

The invention will be more clearly understood from the following description of some embodiments thereof given by way of example only with reference to the accompanying drawings, in which

DRAWINGS

Figure 2:
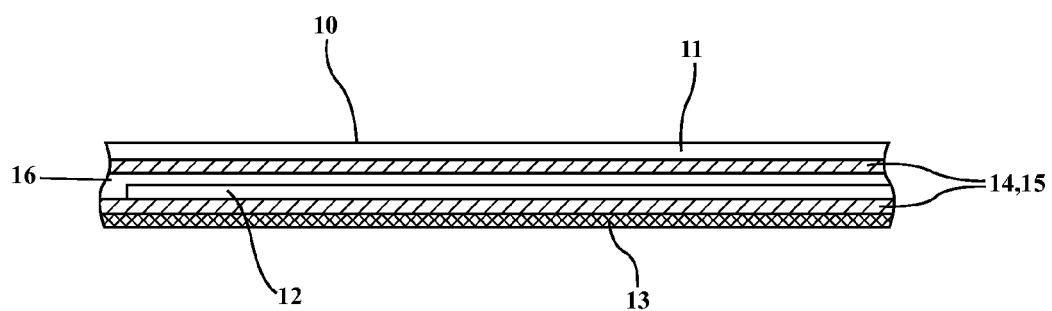
Figure 3:
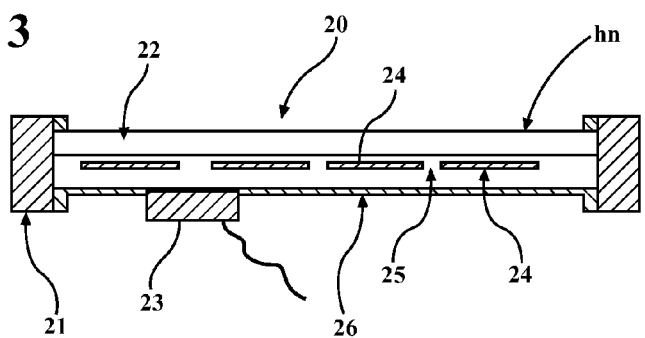
Figure 4:
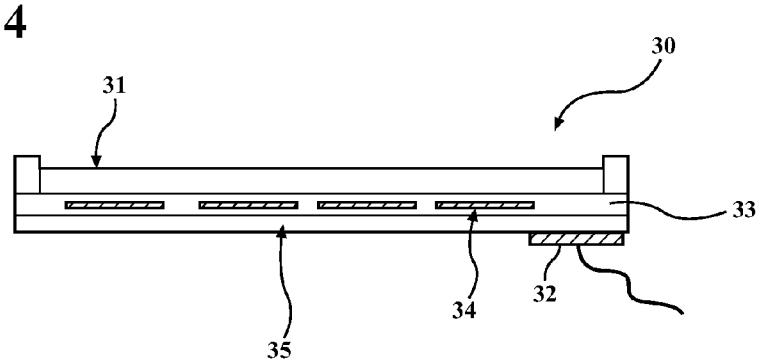
Figure 5:
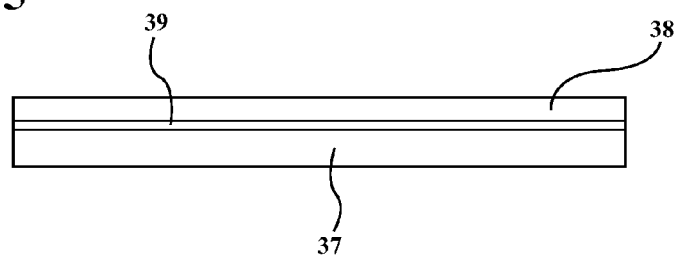

FIG. 1 illustrates a conventional solar cell module in a frame;
FIG. 2: illustrates a further conventional thin film solar cell;
FIG. 3: illustrates a wafer type solar module;
FIG. 4: illustrates a wafer type solar module without a classical perimeter aluminum frame;
FIG. 5: illustrates a preferred solar module encapsulation process for wafer type solar modules; and
FIG. 6: illustrates a continuous encapsulation process of making a wafer type solar cell module.

FIGS. 1 and 2 illustrate conventional wafer type solar cell modules. In FIG. 1 there is provided a wafer type solar cell module 1 with a Tedlar® substrate or backskin 2. The module also consists of a front glass superstrate 3, interconnected solar cells 4 sandwiched between two EVA sheets 5,6. A further interconnecting layer 9 comprising any suitable material may be provided between EVA sheets 5,6, however, typically interconnecting layer 9 comprises a mixture of materials from the two EVA sheets 5,6. Typically Tedlar® substrate or backskin 2 is prelaminated to EVA sheet 6 before lamination in the solar cell module. The module 1 is edged with rubber seal 7 that makes a junction to an aluminium frame 8. In FIG. 2 there is shown a conventional thin film type solar cell module 10 with a TEFZEL superstrate 11, a thin film silicon solar cell 12 on stainless steel substrate 13, sandwiched between two EVA sheets 14, 15. A further interconnecting layer 16, comprising a suitable material may be provided between EVA sheets 14 and 15, however, typically interconnecting layer 16 comprises a mixture of materials from the two EVA sheets 14,15. In both cases, the encapsulation is obtained by means of lamination techniques such that the different layers shown are laminated with their neighbours. This process can be labourious and must be carried out in a batch type process.

FIG. 3: illustrates a wafer type solar module 20 with a perimeter aluminium frame 21, a front glass superstrate 22, a junction box 23 and interconnected solar cells 24 encapsulated in accordance with a cured silicone encapsulant 25 in accordance with the present invention. In this example a substrate 26 is shown but whilst this may be utilised typically the encapsulant of the present invention to encapsulate a solar cell module should suffice without the need for any such backskin unless there is a specific reason due to the application involved.

FIG. 4: illustrates a wafer module 30 without a classical perimeter aluminium frame of the type indicated as 21 in FIG. 3. It comprises a front glass superstrate 31 and a junction box 32. Interconnected wafer type solar cells 34 are provided in predetermined positions relative to each other 34 and the superstrate 31 in a layer of silicone adhesive 33. A top-coat of silicone encapsulant 35 is provided as a hard surface to protect the wafers 34 from the environment in order to enhance the lifetime of the solar module as a means of generating electricity from sunlight. Electrical leads linking adjacent wafers 34 are coated in such a way that they may be further bonded into the back skin material or as in this case the silicone encapsulant to form an integral seal.

FIG. 5: is provided to illustrate an encapsulated thin film type solar module in accordance with the present invention. There is provided a substrate or support 37 onto which has been coated a thin film of suitable semi-conducting material 39. The thin film is encapsulated using a layer of the silicone encapsulant 38 in accordance with the present invention. Typically, the thin film will have been applied previously onto substrate 37 by, for example, chemical vapour deposition or sputtering techniques.

Figure 6:
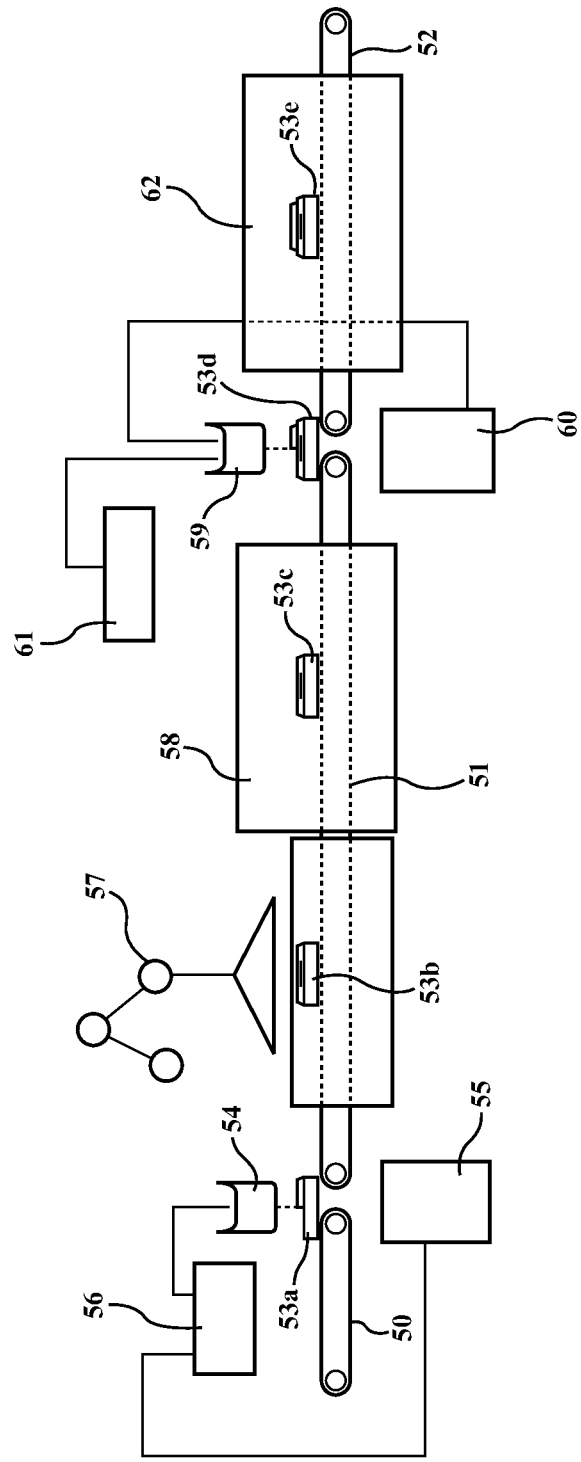

FIG. 6 is intended to assist the reader to appreciate the continuous encapsulation process described in the present invention. The process described relates to the encapsulation of a wafer type solar cell modules requiring both an adhesive layer and an encapsulant layer to fully encapsulate the module. There are provided three conveyor belts 50, 51, 52 for transporting solar cell modules 53a, 53b, 53c, 53d, 53e through the stages of the encapsulation process. There is also provided a first curtain coater 54 for application of silicone adhesive. A collector 55 is positioned under curtain coater 54 to collect unused silicone adhesive. A pump (not shown) is provided to return said unused silicone adhesive from collector 55 to a storage tank 56 which supplies silicone adhesive to curtain coater 54. A six-axis robot 57 is utilised for the accurate placement of solar cells or groups of interconnected solar cells into or onto a layer of uncured silicone adhesive on module 53b before curing of the silicone adhesive. Any suitable number of electrically interconnected solar cells may be utilised. A first oven 58 is provided as the means of curing the adhesive layer. A second curtain coater 59 is provided for the application of silicone encapsulant onto the cured adhesive layer of module 53d. A collector 60 is provided to collect unused silicone encapsulant which is returned to a storage tank 61 or direct to curtain coater 59 for reuse. A second oven 62 is provided to cure the encapsulant layer onto the adhesive layer.

In use a Solar cell module is initially placed on conveyor belt 50 and is transported to the end of conveyor 50 and through a curtain of liquid silicone adhesive supplied by curtain coater 54, as indicated by module 53a. Subsequent to application of the liquid silicone adhesive the module is transported along conveyor 51 to a predetermined position (as identified by module 53b) where a solar cell or series of interconnected solar cells are accurately positioned at a predetermined position in or on the uncured liquid adhesive layer by robot 57. Subsequent to the positioning of the cell(s), the module continues to be transported along conveyor 51 through a continuous oven 58 (it will be appreciated that the continuous oven is only one of the alternative means of curing the adhesive layer). Preferably when used the oven is of an IR type.

After the adhesive layer has been cured in oven 58 thereby rigidly positioning the cell(s) in the module, a module is transported to the end of conveyor 51 to the second curtain coater 59 where a layer of liquid silicone encapsulant is applied (53d). The module is then transported through oven 62 on conveyor 52 in order to cure the encapsulant layer on top of the adhesive layer (53e), after which the fully encapsulated solar cell may be removed from the conveyor and stored for future use.

EXAMPLES

Example 1

Preparation of Silicone Composition of this Invention 35.42 g of α,ω-dimethylvinylsiloxy terminated polydimethylsiloxane having a molecular weight of 62000 g/mole and vinyl content of 0.15%; 7 g of poly(dimethyl siloxane-co-methylhydrogensiloxane) containing 1.45% of hydrogen units; 47.22 g of p-xylene solution of dimethylvinylated MQ resin (63% resin in Xylene) were intimately mixed and the p-xylene stripped out under reduced pressure. After solvent removal, 0.825 g of dimethylhydrogen siloxy terminated trifluoropropyl silsesquioxane and 20 ppm of platinum catalyst dissolved in a low molecular weight vinyl polymer were added to the blend to make the final composition. The silicone composition was coated onto a 20 cm×20 cm glass panel and cured at 120° C. for 30 minutes. Table 1 gives the ultra violet (UV) & Visual (V) light transmission data of a 200 µm film of this composition as compared to commercial EVA film of the same thickness. The silicone composition shows a higher light transmission at 300 and 500 nm and similar transmission at 633 mm. The absorbed UV energy causes EVA to yellow and to brown and this effect is known to affect the visible light transmission.

TABLE 1

Comparative Ultraviolet and Visible light transmission as a function of wavelength for EVA (ELVAX) and silicone material prepared in example 1.

| | | % Transmittance | | | |
|---|---|---|---|---|---|
| Samples | Sample | 633 nm | 500 nm (499.43) | 400 mm (400.20) | 300 mm (299.67) |
| EVA1 (200 µm) | 1 | 78 | 75 | 70 | 1 |
| EVA3 (200 µm) | 2 | 85 | 83 | 80 | 0 |
| EVA3 (200 µm) | 3 | 85 | 83 | 80 | 1 |
| Silicone material 200 (µm) | 1 | 84 | 83 | 81 | 73 |
| Silicone material 200 (µm) | 2 | 83 | 82 | 80 | 73 |

Values recorded here are lower than the actual due to the light reflection effect on sample surface Example 2

Silicone Composition that Exhibit Higher Taber Abrasion Resistance than the ETFE/EVA Laminates Film samples of similar composition as the one described in example 1 were submitted to a Taber abrasion tester (Taber 5131 equipped with calibrase CS-10 abrading wheels) while measuring the light transmission change as function of number of cycles. FIG. 1 indicates that after 40 and 80 cycles, Tefzel® has lost 25% and 35% of the light transmission respectively while the silicone encapsulate of this invention has lost only 8% of the light transmission after 100 cycles.

TABLE 2

% of light Transmission loss as a function of abrasion cycles (Taber 5131, Calibrase CS-10) (1): Tefzel ® 25 µm (2) and (3) silicone encapsulant of this invention having 100 µm and 200 µm thickness. A laminate of EVA/TEFZEL ® having 200 µm thickness did not show higher abrasion resistance than sample 1.

| Number of Cycles | Tefzel ® Thickness: 25 µm | Silicone Encapsulant Thickness: 100 µm | Silicone encapsulant Thickness: 200 µm |
|---|---|---|---|
| 0 | 100 | 100 | 100 |
| 5 | 80.6 | 98.3 | 98.3 |
| 20 | | 96.5 | 96.5 |
| 40 | 76.2 | — | — |
| 60 | 74.2 | 92.5 | 94.2 |
| 80 | 70.4 | | |
| 100 | | 91.1 | 93.6 |

Example 3

Shore A Hardness of Cured Silicone Compositions in Accordance with the Invention Showing a Gradient Toughness from the Surface to the Bulk Samples of similar composition as the one described in example 1 were cured in an aluminium cup to make 3 mm thick flat samples. The catalyst concentration was varied from 3.6 ppm to 7.1 ppm and the samples allowed to cure for 30 minutes at 120° C., FIG. 2 shows the variation of hardness in shore A for both top surface and the bottom surface of the sample as a function of catalyst concentration. At 2.8 ppm, the sample is skinned at the surface but do not fully cure. The example shows that the top surface is harder than the bottom surface indicating a faster or complete cure at the surface than in the bulk. The comparatively high hardness values indicate a high abrasion resistance and good surface properties, while low hardness value (bottom surface) indicates softer material, good for cell protection. Hard material which is in contact with a solar cell surface is likely to induce high stress at the cell/material surface and therefore a potential premature delamination, especially during thermal cycle change.

TABLE 3

Variation of Hardness as a function of platinum concentration for the top surface and the bottom surface of a silicone encapsulation of this invention cured in an aluminium cup.

| Pt Catalyst | Hardness (Shore A) Top Surface | Hardness (Shore A) Bottom Surface |
|---|---|---|
| 3.6 | 48.4 | 46.9 |
| 4.3 | 49.5 | 46.4 |

TABLE 3-continued

Variation of Hardness as a function of platinum concentration for the top surface and the bottom surface of a silicone encapsulation of this invention cured in an aluminium cup.

| Pt Catalyst | Hardness (Shore A) Top Surface | Hardness (Shore A) Bottom Surface |
|---|---|---|
| 5 | 50.1 | 47.5 |
| 5.7 | 50.4 | 47.4 |
| 6.4 | 50.1 | 47.6 |
| 7.1 | 50.2 | 48 |

Example 4

Adhesion of the Encapsulant in Accordance with the Invention onto a Glass Panel after Damp Heat Test Samples of silicone encapsulant of similar composition as the one described in example 1 were coated onto a 20 mm×20 mm glass panel to make a 1000 μm thick layer. A 15 mm×15 mm silicon wafer of 650 μm thickness was immersed into the liquid encapsulant and then the assembly cured for 30 minutes at 120° C. The cured sample was submitted to a humidity/temperature aging test (80° C./85% Relative Humidity (RH)) for 41 days. No visible delamination could be observed, even after 60 days, the sample was still exhibiting a very good adhesion to the glass.

Example 5

Coating Glass Panels with a Modified Curtain Coater of this Invention and Silicone Solar Encapsulant of this Invention 40 kg of the silicone encapsulant of this invention having a viscosity of 7000 mPa·s was fed into a curtain coater having 9 kg of polymer hold up and then pumped at 5.5 kg/min to make a nice curtain. 500×500 mm glass panels were fed continuously into the coater at 45 m/min to form a polymer film of 70 μm, after 6 passes under the curtain, a nice polymer film of 433 μm thickness was formed. The glass was then fed at 1 m/min into a 1 meter long infrared oven equipped with four lamps of 1000 watts each. The sample hardens rapidly to impart a high scratch resistance surface to the glass surface.

Example 6

Coating Solar Glass Panels with a Modified Curtain Coater of this Invention and Silicone Solar Encapsulant of this Invention Example 5 was repeated except that four interconnected solar cells were manually glued on to the glass panels using a silicone base adhesive layer of 100 μm. The solar glass with the interconnect on the top side was passed through the curtain at 20 m/min to make a top layer of 200 μm, repeating the coating step once resulted in a solar panel coated with 400 μm encapsulating the interconnect. The top layer is then hardened by passing it at 0.5 m/min in 0.8 m long Infrared tunnel equipped with 8 kW IR lamps from Heraeus.

Example 7

Encapsulation of a First Series of Interconnected Commercially Available a-Si Thin Film Cells with the Silicone Encapsulant of the Present Invention A glass substrate was initially cleaned using a suitable solvent, in this case acetone and then the glass plate/thin film was treated with methacrylopropyltrimethoxysilane and dried using compressed air. The encapsulant used comprised 45 weight % of α,ω-dimethylvinylsiloxy terminated polydimethylsiloxane having a molecular weight of 62000 g/mole and vinyl content of 0.15%; 18.6 weight % of trimethoxy terminated co polymer of dimethyl siloxane-co-methylhydrogensiloxane containing 1.45% of hydrogen units; 30.3 weight % (solids) of p-xylene solution of dimethyl vinylated MQ resin (63% resin in Xylene) 5 weight % of adhesion promoter, 0.14 weight % of diallylmaleate cure inhibitor, 0.11 weight % of platinum catalyst and 0.38 weight % of dimethylhydrogen siloxy terminated trifluoropropyl silsesquioxane.

The encapsulant was applied onto the module manually and after levelling, was cured in a standard oven at a temperature of 120° C. for 20 mins.

The electrical capabilities were measured before and after the 10 day aging process set down in the Humidity Freeze test described in IEC 1646, which comprised 10 cycles of 24 hours with the temperature varying from −40° C. to 85° C. in 85% relative Humidity (RH) and the results are provided in Table 4 below

TABLE 4

| Name | | Pmax (W) | Pmax delta (%)/ previous meas. |
|---|---|---|---|
| Control cell | Sample before conditioning | 5.389 | |
| | Sample after 10 days | 5.600 | 3.9% |
| Sample without frame | Sample before conditioning | 5.206 | |
| | Sample after 10 days conditioning | 5.053 | −2.9% |
| Sample with frame | Sample before conditioning | 4.979 | |
| | Sample after 10 days conditioning | 4.908 | −1.4% |

None of the samples tested showed any discoloration or delamination and all samples passed the standard wet leakage current test as defined in the IEC 1646 after the conditioning period.

In accordance with the requirements of IEC 1646 after conditioning a sample should not show any open circuit or leakage current, any visual defect and any decrease in maximum power should not be greater than 5% all of which the thin film modules of the present invention using the encapsulant alone (i.e. no adhesive layer required). These findings are totally contrary to the expectations of the industry and use of a silicone encapsulant as hereinbefore described is able to provide the level of protection suitable for solar or photovoltaic module.

Example 8

Humidity Freeze Testing of a Different Series of Interconnected Commercially Available a-Si Thin Film Cells With the exception that the glass was washed with ethanol instead of acetone and that a different type of commercially available solar cell was used, the procedure followed was identical to the procedure in Example 7 above and as set down in IEC 1646.

Sample Characterization:

The electrical capabilities were measured before and after the 10 day aging process set down in the Humidity Freeze test described in IEC 1646, which comprised 10 cycles of 24 hours with the temperature varying from −40° C. to 85° C. in 85% relative Humidity (RH) Electrical characterization of the samples were carried out both before and after conditioning and the results are summarized in Table 5 below.

TABLE 5

| Description | Conditioning | Pmax (W) | Pmax delta (%)/ previous meas. |
|---|---|---|---|
| Type a | | | |
| Reference | Before conditioning | 1.13 | |
| No conditioning | After 10 days | 1.13 | −0.4% |
| Specimen 1a | Before conditioning | 1.11 | |
| Frame | After 10 days conditioning | 1.153 | 4.3% |
| Specimen 2a | Before conditioning | 1.21 | |
| No frame | After 10 days conditioning | 1.24 | 2.5% |
| Type b | | | |
| Reference | Before conditioning | 1.14 | |
| | After 10 days | 1.12 | −1.5% |
| Specimen 1b | Before conditioning | 1.2 | |
| Frame | After 10 days conditioning | 1.16 | −0.9% |
| Specimen 2b | Before conditioning | 1.25 | |
| Unframe | After 10 days conditioning | 1.25 | −0.5% |
| Type c | | | |
| Reference | Before conditioning | 1.13 | |
| | After 10 days | 1.14 | 0.4% |
| Specimen 1c | Before conditioning | 1.11 | |
| Frame | After 10 days conditioning | 1.12 | 0.9% |
| Specimen 2c | Before conditioning | 1.15 | |
| Unframe | After 10 days conditioning | 1.16 | 0.7% |
| Type d | | | |
| Reference | Before conditioning | 1.20 | |
| | After 10 days | 1.17 | −2.3% |
| Specimen 1d | Before conditioning | 1.17 | |
| Frame | After 10 days conditioning | 1.15 | −2.0% |
| Specimen 2d | Before conditioning | 1.15 | |
| Unframe | After 10 days conditioning | 1.16 | 1.3% |

None of the samples tested showed any discoloration or delamination and all samples passed the standard wet leakage current test as defined in the IEC 1646 after the conditioning period.

In accordance with the requirements of IEC 1646 after conditioning a sample should not show any open circuit or leakage current, any visual defect and any decrease in maximum power should not be greater than 5% all of which the thin film modules of the present invention using the encapsulant alone (i.e. no adhesive layer required).

These findings are totally contrary to the expectations of the industry and use of a silicone encapsulant as hereinbefore described is able to provide the level of protection suitable for solar or photovoltaic module with both framed and unframed modules Example 9

Encapsulation of p-Si Wafer Type 1 with Adhesive and Encapsulant

A glass substrate was initially cleaned using a suitable solvent, in this case acetone and then the glass plate/thin film was treated with methacrylopropyltrimethoxysilane and dried using compressed air. The adhesive used comprised 27.5 weight % of α,ω-dimethylvinylsiloxy terminated polydimethylsiloxane having a viscosity of about 10 000 mPa·s, molecular weight of 62000 g/mole and vinyl content of 0.15%; 45.8 weight % of α,ω-dimethylvinylsiloxy terminated polydimethylsiloxane having a viscosity of about 450 mPa·s, 3 weight % of trimethoxy terminated co polymer of dimethyl siloxane-co-methylhydrogensiloxane containing 1.45% of hydrogen units; 18.3 weight % (solids) of p-xylene solution of dimethyl vinylated MQ resin (63% resin in Xylene) 5 weight % of adhesion promoter, 0.24 weight % of diallylmaleate cure inhibitor, 0.19 weight % of platinum catalyst.

The adhesive was cured in place using a hot plate by heating for 7 min at 120° C. or in a continuous process after application by a curtain coater the adhesive was cured in the module in a Mid IR oven having a temperature profile of 120° C. and a speed of 0.5 m per minute for a length of 5 m.

The encapsulant composition was the same as detailed in Example 7. Encapsulant was applied onto the cured adhesive either manually in the lab or by means of a curtain coater. The encapsulant was cured in place using a hot plate by heating for 7 min at 120° C. or in a continuous process after application by a curtain coater the adhesive was cured in the module in a Mid IR oven having a temperature profile of 120° C. and a speed of 0.5 m per minute for a length of 5 m.

The electrical capabilities were measured before and after the 10 day aging process set down in the Humidity Freeze test described in IEC 1215, which comprised 10 cycles of 24 hours with the temperature varying from −40° C. to 85° C. in 85% relative Humidity (RH)

Sample Characterization:

Electrical characterization of the specimen has been done before and after conditioning, results are summarized in table 6 below

TABLE 6

| Name | Condition | Pmax (W) | Pmax delta (5)/ previous meas. |
|---|---|---|---|
| Sample 1 | Before conditioning | 1.71 | |
| | After 5 days conditioning | 1.70 | −0.5% |
| | After 10 days conditioning | 1.73 | 1.8% |
| Sample 2 | Before conditioning | 1.29 | |
| | After 5 days conditioning | 1.30 | 1.1% |
| | After 10 days conditioning | 1.42 | 9.2% |
| Sample 3 | Before conditioning | 1.64 | |
| | After 5 days conditioning | 1.70 | 3.9% |
| | After 10 days conditioning | 1.75 | 2.9% |
| Sample 4 | Before conditioning | 1.38 | |
| | After 5 days conditioning | 1.40 | 1.2% |
| | After 10 days conditioning | 1.51 | 7.9% |

None of the samples were showing discoloration or delamination and were passing the wet leakage current test as described in the IEC 1215 after the conditioning.

In accordance with the requirements of IEC 1215 after conditioning a sample should not show any open circuit or leakage current, any visual defect and any decrease in maximum power should not be greater than 5% all of which the thin film modules of the present invention using the encapsulant alone (i.e. no adhesive layer required). These findings are totally contrary to the expectations of the industry and use of a silicone encapsulant as hereinbefore described is able to provide the level of protection suitable for solar or photovoltaic module of a polycrystalline Silicon wafer type.

Example 10

Encapsulation of Second Type Commercially Available p-Si Wafer with Adhesive and Encapsulant In this case the only difference from example 8 was the change in the solar cells used. The adhesive and encapsulant compositions were as described in example 8.

The electrical capabilities were measured before and after the 10 day aging process set down in the Humidity Freeze test described in IEC 1215, which comprised 10 cycles of 24 hours with the temperature varying from −40° C. to 85° C. in 85% relative Humidity (RH)

The results are provided in Table 7 below

TABLE 7

| Name | Condition | Pmax (W) | Pmax delta (%)/ previous meas. |
|---|---|---|---|
| Sample 1 | Before conditioning | 1.70 | |
| | After 5 days conditioning | 1.70 | 0.0% |
| | After 10 days conditioning | 1.70 | 0.0% |
| Sample 2 | Before conditioning | 1.70 | |
| | After 5 days conditioning | 1.70 | 0.0% |
| | After 10 days conditioning | 1.80 | 5.9% |
| Sample 3 | Before conditioning | 1.70 | |
| | After 5 days conditioning | 1.70 | 0.0% |
| | After 10 days conditioning | 1.80 | 5.9% |

None of the samples were showing discoloration or delamination and were passing the wet leakage current test as described in the IEC 1215 after the conditioning.

In accordance with the requirements of IEC 1215 after conditioning a sample should not show any open circuit or leakage current, any visual defect and any decrease in maximum power should not be greater than 5% all of which the thin film modules of the present invention using the encapsulant alone (i.e. no adhesive layer required). These findings are totally contrary to the expectations of the industry and use of a silicone encapsulant as hereinbefore described is able to provide the level of protection suitable for solar or photovoltaic module of a polycrystalline Silicon wafer type.

Example 11

Coating Glass Panels with a Modified Curtain Coater of this Invention and Silicone Solar Encapsulant of this Invention 40 Kg of the silicone encapsulant of this invention having a viscosity of 7000 mPa·s was fed into a curtain coater and was then pumped at 5.5 Kg/min to make a suitable curtain. 500×500 mm glass panels were fed continuously into the coater at 45 m/min to form a polymer film of 70 µm, after 6 passes under the curtain, an encapsulant film of 433 µm thickness was formed. The glass was then fed at 1 m/min into 1 meter long infrared oven equipped with 4 lamps of 1000 watts each. The encapsulant cured rapidly to impart a high scratch resistance surface to the glass surface.

Example 12

Coating Solar Glass Panels with a Modified Curtain Coater of this Invention and Silicone Solar Encapsulant of this Invention Example 11 was repeated except that 4 interconnected solar cells were manually glued on to the glass panels by applying a layer of the adhesive having a thickness of 100 µm. The solar glass with the interconnect on the top side was passed through the curtain at 20 m/min to make a top layer of 200 µm, repeating the coating step once resulted in a solar panel coated with 400 µm encapsulating the interconnect. The top layer was then cured by passing through a 0.8 m long Infrared tunnel equipped with 8 kW IR lamps from Heraeus it at a speed of 0.5 m/min.

Example 13

A series of standard electrical tests were carried out in respect to wafer type modules encapsulated in accordance with the present invention as compared to standard modules made with EVA/TEDLAR laminate technology. The modules made in accordance with the present invention comprised a float glass superstrate (size 200 mm×200 mm×3 mm) and a solar cell (size 125 mm×125 mm×350 µm) made from polycrystalline silicon which had been coated in silicon nitride. All modules tested were framed, prior to the application of the adhesive layer, in the lab using aluminium L-shaped profile frames in combination a suitable curable sealant adapted to seal the edges of the module and the frame. Each framed module in accordance with the present invention was encapsulated by first applying a layer of the silicone adhesive on to the glass plate. The solar cell (i.e. a silicon wafer) was then placed on to or into the adhesive by a six axis robot to ensure that the cell was correctly positioned. The adhesive layer, containing/comprising the cell was then cured using a hot plate. A layer of encapsulant was then applied on to the cured adhesive layer and subsequently cured in an oven. Encapsulated modules in accordance with the present invention were made using the adhesive having a formulation as described in Example 9 above and the encapsulant having a formulation as described in example 7 above. The standard comparative solar cells were standard modules made with EVA/TEDLAR laminate technology supported by tempered glass superstrates. The laminated modules were also framed as above using identical frames and sealant.

UV Conditioning

The UV conditioning test followed the *Irradiation test A*-5, p13" procedures set down in Japanese International standard Test "JIS C 8917 Environmental and endurance test method for crystalline solar PV modules with reference to "JIS B 7753 Light-exposure and light-and-water-exposure apparatus" describing the UV ageing conditions. A Xenon Lamp (Wavelength range: 340 nm) provided a continuous UV radiation at the surface of the sample: of 244.63 W/m$^2$ in 50% Relative Humidity for 600 hours. The resulting aged modules were subsequently conditioned for 2 h at room temperature prior to testing. The sequence of test performed followed JIS C 8917. The variation in electrical performance of the modules between initial and post ageing are provided in Tables 8 (VA/TEDLAR® and 9 (present invention) in which the following parameters are provided Temperature, Intensity of Short Circuit (Isc/Ampere(A)), Open circuit voltage (Voc), maximum voltage (Vmax), maximum current intensity (Imax), Fill factor, and maximum power. In order to pass the test each sequential test had to be achieved and the difference between the initial and final Pmax had to be <5%.

Tables 8 and 9 show the relative changes (delta results) comparing the initial and post ageing electrical performance of the standard modules (Table 8) and the modules in accordance with the present invention (Table 9).

TABLE 8

Delta results for EVA/Tedlar based solar modules after UV ageing 600 h

| EVA/Tedlar | Δ Temp % | Δ ISC % | Δ Voc % | Δ Vmax (V) % | Δ Imax (A) % | Δ FF (%) | Δ Pmax (W) | Visuals |
|---|---|---|---|---|---|---|---|---|
| Reference | 0.7 | −0.8 | 0.3 | −1.0 | 0.5 | −0.1 | −0.5 | Ok |
| Comp A | 1.1 | −1.4 | −0.3 | −2.2 | 0.1 | −0.3 | −2.0 | Ok |
| Comp B | 1.3 | −0.9 | 0.7 | −1.9 | 0.7 | −1.0 | −1.2 | Ok |
| Mean % For Comps A and B | 1.2 | −1.15 | 0.2 | −2.05 | 0.4 | −0.65 | −1.6 | N/A |

TABLE 9

Delta results for Modules encapsulated in accordance with the present invention after UV ageing 600 h

| DC Encapsulant & adhesive | Δ Temp % | Δ ISC % | Δ Voc % | Δ Vmax (V) % | Δ Imax (A) % | Δ FF (%) | Δ Pmax (W) | Visuals |
|---|---|---|---|---|---|---|---|---|
| Ex Reference | -1.3 | -1.5 | 0.6 | -2.3 | 0.1 | -1.3 | -2.3 | Ok |
| Ex A | 0.4 | -2.4 | 0.4 | -2.3 | 0.03 | 0.3 | -2.3 | Ok |
| Ex B | 0.3 | -1.9 | 0.7 | -4.0 | -0.1 | -1.7 | -2.3 | Ok |
| Ex C | 0.02 | -0.3 | -0.4 | -0.4 | -0.03 | 0.2 | -0.5 | Ok |
| Mean % For Ex A, B, and C | 1.24 | -1.53 | 0.23 | -2.23 | -0.03 | -0.4 | -1.7 | N/A |

The Reference and Ex Reference were aged under standard laboratory conditions. Comp A and Comp B are seen to have lost more Power and FF than the reference, however both passed the test by having less than 5% change after ageing.

Table 9 shows that all the samples in accordance with the present invention were encapsulated with no initial failure and passed the test. The loss in power is generally similar to the results for the Ex Ref sample. In general all the samples submitted to the 600 h QUV ageing did not lose their property at all compared to the reference.

Example 14

Thermal Cycling 50 Cycles+Humidity Freeze 10 Cycles Sequence i) Initial and final Electrical performance results were compared for a further series of modules of the types described in example 13. The thermal cycling (50 cycles)+Humidity Freeze (10 cycles) sequences were followed in accordance with IEEE 1262-1995 testing worksheet, p. 22. (and IEC 6-1215, and UL1703).

Tables 10 and 11 provided the percentage changes in Pmax tested prior to and after ageing. Any loss in Pmax of more than 5% is considered a failure. This test subjects samples to ageing conditions which enable the evaluation of the prospective ability of modules to withstand thermal expansion and contraction (through the thermal cycling) and to resist water penetration when submitted to extreme conditions of temperature and humidity (Humidity Freeze).

Table 10 and 11 compare deltas results between the initial values and the final ones for the standard EVA/TEDLAR® laminated solar modules (Table 10) and the solar modules encapsulated in accordance with the present invention.

TABLE 10

EVA/Tedlar deltas results after 50 Thermal Cycles + 10 cycles Humidity Freeze conditions

| EVA/Tedlar | Δ Temp % | Δ ISC % | Δ Voc % | Δ Vmax (V) % | Δ Imax (A) % | Δ FF (%) | Δ Pmax (W) % |
|---|---|---|---|---|---|---|---|
| Reference | 0.3 | -0.9 | -0.6 | -2.1 | -0.5 | -1.2 | -2.2 |
| Comp C | -0.5 | 0.4 | -1.4 | -0.4 | -0.7 | 0.0 | -1.1 |
| Comp D | -0.1 | -0.6 | -1.5 | -1.4 | -1.7 | -1.1 | -3.0 |
| Comp E | -0.7 | -0.2 | -1.5 | -0.2 | -0.1 | 1.5 | -0.3 |
| Mean % For Comps C, D, and E | -0.43 | -0.13 | -1.47 | -0.67 | -0.83 | 0.13 | -1.47 |

TABLE 11

Encapsulant/adhesive in accordance with the present invention deltas results after 50 Thermal Cycles + 10 cycles Humidity Freeze conditions

| Encapsulant & adhesive | Δ Temp % | Δ ISC % | Δ Voc % | Δ Vmax (V) % | Δ Imax (A) % | Δ FF (%) | Δ Pmax (W) % |
|---|---|---|---|---|---|---|---|
| Reference | -1.4 | -0.8 | -0.8 | -2.1 | -0.4 | -0.9 | -2.5 |
| Ex D | 0.5 | -1.5 | -0.2 | -2.7 | 0.5 | -0.5 | -2.2 |
| Ex E | -0.3 | -0.8 | -0.7 | -1.8 | -1.7 | -2.5 | -3.8 |
| Ex F | -0.3 | -1.4 | -0.2 | -2.5 | 0.0 | -0.9 | -2.5 |
| Mean % For Ex D, E, and F | -0.03 | -1.23 | -0.37 | -2.33 | -0.40 | -1.30 | -2.83 |

In both Tables 10 and 11, the final electrical performance results are all deemed to pass the test (less than 5% change). Hence from the above it will be appreciated that use of an encapsulant and in the case of this example an adhesive as described in accordance with the present invention provides a simpler and continuous method of encapsulating solar cells as opposed to the traditional batch/lamination processes and the resulting encapsulated solar modules give good electrical performance results.

Example 15

Further samples as described in Example 13 were subjected to the sequence of test commonly referred to as Damp Heat Conditioning as defined in each of IEC 6-1215, IEEE 1262, UL1703. The results provided in Tables 12 and 13 are determined by the relative percentage change of initial and final electrical test results. Any loss in Pmax of more than 5% was deemed a failure. Tables 12 and 13 contrast the results between the initial and the final electrical values ones for the two encapsulation technologies.

TABLE 12

EVA/Tedlar deltas results after 1000 hours in Damp Heat conditions

| EVA/Tedlar | Δ Temp % | Δ ISC % | Δ Voc % | Δ Vmax (V) % | Δ Imax (A) % | Δ FF (%) | Δ Pmax (W) % |
|---|---|---|---|---|---|---|---|
| Reference | 0.4 | −2.0 | 0.2 | −2.9 | 0.2 | −0.9 | −2.5 |
| Comp F | −0.1 | −0.7 | 1.1 | 0.2 | 1.6 | 1.5 | 1.9 |
| Comp G | −1.1 | −0.6 | 0.1 | −1.4 | 0.1 | −0.8 | −1.2 |
| Comp H | −0.8 | −0.6 | 0.9 | −0.6 | 0.4 | −0.3 | −0.2 |
| Mean % For Comps F, G, and H | −0.67 | −0.63 | 0.70 | −0.60 | 0.70 | 0.13 | 0.17 |

TABLE 13

Encapsulant/Adhesive deltas results after 1000 hours in Damp Heat conditions

| DC Encapsulant | Δ Temp % | Δ ISC % | Δ Voc % | Δ Vmax (V) % | Δ Imax (A) % | Δ FF (%) | Δ Pmax (W) % |
|---|---|---|---|---|---|---|---|
| Reference | −1.5 | −2.2 | −0.1 | −2.9 | 0.0 | −0.6 | −2.9 |
| Ex G | −0.9 | −1.6 | −0.6 | −1.6 | −0.2 | 0.3 | −1.9 |
| Ex H | −1.4 | −1.8 | −1.2 | −1.0 | −0.2 | 1.8 | −1.3 |
| Ex I | 0.1 | −1.1 | 0.1 | −2.1 | −0.2 | −1.2 | −2.2 |
| Mean % For Ex G, H, and I | −0.73 | −1.50 | −0.57 | −1.57 | −0.20 | 0.30 | −1.80 |

Both tables 12 and 13 indicate that the changes in electrical properties pass the test.

The invention claimed is:

1. A solar cell module comprising:
   (1) a rigid or flexible superstrate;
   (2) a silicone adhesive disposed on said superstrate and formed from a silicone adhesive composition that has a viscosity of from 100 to 2,000 mPa·s at 25° C. before curing and comprises;
      (Ai) 100 parts by weight of a first liquid diorganopolysiloxane having at least two Si-alkenyl groups per molecule,
      (Bi) 20 to 40 parts by weight of a first silicone resin containing at least two alkenyl groups,
      (Ci) a first cross-linking agent in the form of a polyorganosiloxane having at least two silicon-bonded hydrogen atoms per molecule, in an amount such that the ratio of the number of moles of silicon-bonded hydrogen to the total number of moles of silicon-bonded alkenyl groups in component (Ai) is from 0.1:1 to 1:1, and
      (Di) a first hydrosilylation catalyst wherein the amount of metal in said hydrosilylation catalyst is from 0.01 to 500 parts by weight per 1,000,000 parts by weight of component (Ai);
   (3) one or more solar cells disposed on said silicone adhesive; and
   (4) a silicone encapsulant disposed on said one or more solar cells and formed from a liquid silicone encapsulant composition comprising;
      (A) 100 parts by weight of a second liquid diorganopolysiloxane having at least two Si-alkenyl groups per molecule and a viscosity of from 100 to 10,000 mPa·s at 25° C.,
      (B) 20 to 50 parts by weight of a second silicone resin containing at least two alkenyl groups,
      (C) a second cross-linking agent in the form of a polyorganosiloxane having at least two silicon-bonded hydrogen atoms per molecule, in an amount such that the ratio of the number of moles of silicon-bonded hydrogen to the total number of moles of silicon-bonded alkenyl groups in component (A) is >1:1, and
      (D) a second hydrosilylation catalyst wherein the amount of metal in said hydrosilylation catalyst is from 0.01 to 500 parts by weight per 1,000,000 parts by weight of component (A).

2. A solar cell module in accordance with claim 1 wherein said one or more solar cells is either a wafer or a thin film and is made from a semi-conductor material.

3. A solar cell module in accordance with claim 1 wherein said one or more solar cells is a wafer and is made from a semi-conductor material that is polycrystalline or single crystal silicon.

4. A solar cell module in accordance with claim 1 wherein said one or more solar cells is a thin film and is made from a semi-conductor material that is thin film silicon or copper indium gallium diselenide.

5. A solar cell module in accordance with claim 1 wherein the ratio of the number of moles of silicon-bonded hydrogen to the total number of moles of silicon-bonded alkenyl groups in component (A) of said liquid silicone encapsulant composition is from >1:1 to 5:1.

6. A solar cell module in accordance with claim 5 wherein said liquid silicone encapsulant composition additionally comprises one or more adhesion promoter(s) and/or an anti-soiling agent(s) and/or cure inhibitor(s) and/or a silane of the formula:

$(R^1O)_3SiR^2$ wherein $R^1$ is an alkyl group comprising 1 to 6 carbon atoms, $R^2$ is selected from the group of an alkoxy group comprising 1 to 6 carbon atoms, an alkyl group comprising 1 to 6 carbon atoms, an alkenyl group comprising 1 to 6 carbon atoms, an acrylic group or an alkyl acrylic group.

7. A solar cell module in accordance with claim 1 wherein the ratio of the number of moles of silicon-bonded hydrogen to the total number of moles of silicon-bonded alkenyl groups in component (Ai) is <1:1.

8. A solar cell module in accordance with claim 1 wherein said silicone adhesive composition additionally comprises an adhesion promoter and/or a cure inhibitor and/or a silane of the formula:

$(R^1O)_3SiR^2$ wherein $R^1$ is an alkyl group comprising 1 to 6 carbon atoms, $R^2$ is selected from the group of an alkoxy group comprising 1 to 6 carbon atoms, an alkyl group comprising 1 to 6 carbon atoms, an alkenyl group comprising 1 to 6 carbon atoms, an acrylic group or an alkyl acrylic group.

9. A solar cell module as set forth in claim 1 wherein said liquid silicone encapsulant composition comprises a resin fraction of between 30% and 50% by weight and said silicone adhesive composition comprises a resin fraction of between 20% and 30% by weight.

10. A solar cell module in accordance with claim 9 wherein said liquid silicone encapsulant composition cures without releasing volatiles.

11. A solar cell module in accordance with claim 9 wherein said silicone encapsulant and/or silicone adhesive exhibits a light transmission substantially equivalent to glass.

12. A solar cell module in accordance with claim 9 wherein said one or more solar cells is pre-treated prior to adhesion and/or encapsulation with a silane of the formula:

$(R^1O)_3SiR^2$ wherein $R^1$ is an alkyl group comprising 1 to 6 carbon atoms, $R^2$ is selected from the group of an alkoxy group comprising 1 to 6 carbon atoms, an alkyl group comprising 1 to 6 carbon atoms, an alkenyl group comprising 1 to 6 carbon atoms, an acrylic group or an alkyl acrylic group.

13. A solar cell module in accordance with claim 2 wherein said semi-conductor material is selected from the group consisting of crystalline silicon, polycrystalline silicon, single crystal silicon, thin film silicon, amorphous silicon, semi crystalline silicon, gallium arsenide, copper indium diselenide, cadmium telluride, copper indium gallium diselenide, and mixtures thereof.

14. A solar cell module in accordance with claim 1 wherein said liquid silicone encapsulant composition cures without releasing volatiles.

15. A solar cell module in accordance with claim 1 wherein said silicone encapsulant exhibits a light transmission substantially equivalent to glass.

16. A solar cell module in accordance with claim 1 wherein said one or more solar cells is pre-treated prior to encapsulation with a silane of the formula:

$(R^1O)_3SiR^2$ wherein $R^1$ is an alkyl group comprising 1 to 6 carbon atoms, $R^2$ is selected from the group of an alkoxy group comprising 1 to 6 carbon atoms, an alkyl group comprising 1 to 6 carbon atoms, an alkenyl group comprising 1 to 6 carbon atoms, an acrylic group or an alkyl acrylic group.

17. A solar cell module in accordance with claim 1 wherein said silicone adhesive exhibits a light transmission substantially equivalent to glass.

18. A solar cell module in accordance with claim 1 that is free of ethylene-vinyl acetate (EVA) copolymer.

19. A module as set forth in claim 1 wherein each of said silicone adhesive and said silicone encapsulant are free of ethylene-vinyl acetate (EVA) copolymer.

20. A module as set forth in claim 1 wherein said silicone encapsulant is an outermost layer of said module.

21. A continuous solar cell module encapsulation process comprising the steps of uniformly applying by spraying, coating or dispensing a predetermined volume of a silicone adhesive composition onto a rigid or flexible superstrate, disposing one or more solar cells on the silicone adhesive composition, uniformly applying by spraying, coating or dispensing a predetermined volume of a liquid silicone encapsulant composition onto the one or more solar cells and curing the silicone adhesive composition and the liquid silicone encapsulant composition thermally or by infrared radiation, wherein the silicone adhesive composition has a viscosity of from 100 to 2,000 mPa·s at 25° C. before curing and comprises:
(Ai) 100 parts by weight of a first liquid diorganopolysiloxane having at least two Si-alkenyl groups per molecule;
(Bi) 20 to 40 parts by weight of a first silicone resin containing at least two alkenyl groups;
(Ci) a first cross-linking agent in the form of a polyorganosiloxane having at least two silicon-bonded hydrogen atoms per molecule, in an amount such that the ratio of the number of moles of silicon-bonded hydrogen to the total number of moles of silicon-bonded alkenyl groups in component (Ai) is from 0.1:1 to 1:1; and
(Di) a first hydrosilylation catalyst wherein the amount of metal in the hydrosilylation catalyst is from 0.01 to 500 parts by weight per 1,000,000 parts by weight of component (Ai); and
the silicone adhesive composition cures to form a silicone adhesive;
wherein the liquid silicone encapsulant composition comprises:
(A) 100 parts by weight of a second liquid diorganopolysiloxane having at least two Si-alkenyl groups per molecule and a viscosity of from 100 to 10,000 mPa·s at 25° C.;
(B) 20 to 50 parts by weight of a second silicone resin containing at least two alkenyl groups;
(C) a second cross-linking agent in the form of a polyorganosiloxane having at least two silicon-bonded hydrogen atoms per molecule, in an amount such that the ratio of the number of moles of silicon-bonded hydrogen to the total number of moles of silicon-bonded alkenyl groups in component (A) is >1:1; and (D) a second hydrosilylation catalyst wherein the amount of metal in the hydrosilylation catalyst is from 0.01 to 500 parts by weight per 1,000,000 parts by weight of component (A); and wherein the liquid silicone encapsulant composition cures to form a silicone encapsulant.

22. A continuous solar cell module encapsulation process in accordance with claim 21 wherein the silicone adhesive composition and the liquid silicone encapsulant composition are cured in a continuous oven.

23. A continuous solar cell module encapsulation process in accordance with claim 21 wherein the layer resulting from the liquid silicone encapsulant composition is a uniform thin film coating having a thickness ranging from 20 μm to 1200 μm.

24. A continuous solar cell module encapsulation process in accordance with claim 21 wherein the silicone adhesive composition is applied on to the rigid or flexible superstrate and cured prior to the introduction of the liquid silicone encapsulant composition.

25. A continuous solar cell module encapsulation process in accordance with claim 21 wherein the means of applying the liquid silicone encapsulant composition is adapted such that the liquid silicone encapsulant composition is applied in a uniform bubble-free or substantially bubble-free film in the solar cell module.

26. A continuous solar cell module encapsulation process in accordance with claim 21 wherein the uniform application of the liquid silicone encapsulant composition results in a layer of the liquid silicone encapsulant composition and deposition of the one or more solar cells into the layer of the liquid silicone encapsulant composition is by automatic placement.

27. A continuous solar cell module encapsulation process in accordance with claim 21 wherein a thermoplastic or thermo-elastomeric material is applied to form a frame surrounding a cured solar cell module to protect edges of the cured solar cell module from water ingress.

28. A continuous solar cell module encapsulation process in accordance with claim 21 wherein a silane of the formula:

$(R^1O)_3SiR^2$ wherein $R^1$ is an alkyl group comprising 1 to 6 carbon atoms, $R^2$ is selected from the group of an alkoxy group comprising 1 to 6 carbon atoms, an alkyl group comprising 1 to 6 carbon atoms an alkenyl group comprising 1 to 6 carbon atoms, an acrylic group or an alkyl acrylic group; is utilised to pre-treat the one or more solar cells prior to adhesion and/or encapsulation.

29. A continuous solar cell module encapsulation process in accordance with claim 21 wherein the liquid silicone encapsulant composition is applied using a curtain coater.

30. A continuous solar cell module encapsulation process in accordance with claim 21 that is free of ethylene-vinyl acetate (EVA) copolymer.

* * * * *